United States Patent
Fukai et al.

(10) Patent No.: US 7,309,879 B2
(45) Date of Patent: Dec. 18, 2007

(54) SEMICONDUCTOR LASER, MANUFACTURING THE SAME AND SEMICONDUCTOR LASER DEVICE

(75) Inventors: Haruki Fukai, Komoro (JP); Hidetaka Karita, Miyota (JP); Atsushi Nakamura, Komoro (JP); Shigeo Yamashita, Machida (JP)

(73) Assignee: Opnext Japan, Inc., Yokohama-shi (JP)

( * ) Notice: Subject to any disclaimer, the term of this patent is extended or adjusted under 35 U.S.C. 154(b) by 0 days.

(21) Appl. No.: 11/350,096

(22) Filed: Feb. 9, 2006

(65) Prior Publication Data
US 2006/0131593 A1    Jun. 22, 2006

Related U.S. Application Data
(62) Division of application No. 10/616,923, filed on Jul. 11, 2003, now Pat. No. 7,029,936.

(30) Foreign Application Priority Data
Jul. 15, 2002    (JP)    ............... 2002-204991
Mar. 20, 2003    (JP)    ............... 2003-076698

(51) Int. Cl.
*H01L 29/04*    (2006.01)
(52) U.S. Cl. .............. 257/59; 257/59; 257/72; 257/E33.006; 257/E33.062
(58) Field of Classification Search .............. 257/59, 257/72, E33.006, E33.062
See application file for complete search history.

(56) References Cited

U.S. PATENT DOCUMENTS
| | | | |
|---|---|---|---|
| 5,786,234 A | 7/1998 | Nagai et al. | |
| 5,835,516 A | 11/1998 | Miyashita et al. | |
| 6,784,010 B2* | 8/2004 | Yamaguchi et al. | .......... 438/39 |
| 2002/0119588 A1 | 8/2002 | Bowen et al. | |
| 2003/0138981 A1 | 7/2003 | Yamaguchi et al. | |
| 2004/0041162 A1 | 3/2004 | Shimoyama et al. | |
| 2004/0233956 A1 | 11/2004 | Sano | |
| 2005/0164420 A1 | 7/2005 | Kuniyasu et al. | |

OTHER PUBLICATIONS
Ito et al. ed., "Handoutai Laser (Semiconductor Laser)," Baifukan, 1991, Chapter 5 (Kayane).
Lin et al., "High-Temperature, Low Threshold Current, and Uniform Operation 1×12 Monolithic AlGaInAs/InP Strain-Compensated Multiple Quantum Well Laser Array in 1.5 μm," *IEEE Transactions on Electron Devices*, Aug. 1999, vol. 46, No. 8, pp. 1614-1618.

* cited by examiner

*Primary Examiner*—George Fourson
*Assistant Examiner*—Thanh Van Pham
(74) *Attorney, Agent, or Firm*—Miles & Stockbridge P.C

(57) ABSTRACT

A semiconductor laser element capable of reducing the contact resistance and the thermal resistance and realizing a high reliability is provided. The semiconductor laser element includes: a semiconductor substrate, an active layer formed on the semiconductor substrate, a ridge having a clad layer formed on the active layer and a contact layer formed on the clad layer, an insulation film covering the side surfaces of the clad layer, and an electrode connected to the contact layer, wherein the insulation layer has an end portion in the ridge thickness direction located between the upper surface and the lower surface of the contact layer.

6 Claims, 29 Drawing Sheets

SEMICONDUCTOR LASER, MANUFACTURING THE SAME AND SEMICONDUCTOR LASER DEVICE

CROSS-REFERENCE TO RELATED APPLICATION

This application is a division of application Ser. No. 10/616,923 filed Jul. 11, 2003.

BACKGROUND OF THE INVENTION

The present invention relates to a semiconductor laser element, a manufacturing technique thereof, and a semiconductor laser device.

A semiconductor laser device is widely used as an optical communication light source and an information device light source. The semiconductor laser device of various package structures are manufactured. Moreover, semiconductor laser elements (semiconductor laser chips) of various structures are manufactured so as to be built in the semiconductor laser device. Among them, a ridge-type semiconductor laser element is known.

The ridge-type semiconductor laser element, for example, has a structure having a semiconductor substrate made of a compound semiconductor, a first clad layer arranged on the main surface of the semiconductor substrate, an active layer arranged on the first clad layer, a second clad layer formed on the active layer, an etching stop layer formed on the second clad layer, a stripe-shaped ridge formed on the etching stop layer, and an insulation film arranged on the etching stop layer so as to cover the side and the top of the ridge. The ridge has a third clad layer formed on the etching stop layer and a contact layer formed on the third clad layer. The contact layer is electrically connected to a first electrode (such as an anode electrode) via an opening formed in the insulation film, and a second electrode (such as a cathode electrode) electrically connected to the semiconductor substrate is arranged on the rear surface of the semiconductor substrate opposite to its main surface.

The first electrode, for example, has a structure having a Ti film, a Pt film, and an Au film formed in this order from the insulation film side. The Ti film is formed mainly so as to suppress diffusion of atoms of the Au film into the ridge. The Pt film is formed mainly so as to enhance the attachment between the Ti film and the Au film. The Au film is formed mainly to suppress oxidization and lower the resistance.

It should be noted that the ridge-type semiconductor laser element is described, for example, in ITO Ryoichi and NAKAMURA Michiharu ed. "Handoutai Laser (Semiconductor Laser)", Baifukan, 1991, Chapter 5 (KAYANE).

Moreover, the ridge-type semiconductor laser element using the Ti/Pt/Au structure for the first electrode is described, for example, in IEEE TRANSACTIONS ON ELECTRON DEVICES, VOL. 46, NO. 8, August 1999 [High-Temperature, Low-Threshold Current, and Uniform Operation 1×12 Monolithic AlGaInAs/InP Strain-Compensated Multiple Quantum Well Laser Array in 1.5 micrometers].

In order to obtain a high reliability in the ridge-type semiconductor laser element, it is necessary to completely cover a clad layer exposed from the ridge side surfaces (two side surfaces located at opposing positions in the ridge width direction) with an insulation film. On the other hand, in order to reduce the contact resistance and the thermal resistance in the ridge, it is necessary to increase the contact area between the contact layer and the electrode. However, in the conventional ridge-type semiconductor laser element, an opening is formed in the insulation film on the ridge with an opening width (width in the same direction as the ridge width) narrower than the ridge width (width of the same direction as the direction intersecting the optical axis) and via this opening, the ridge contact layer is connected to the electrode. Accordingly, the contact resistance and the thermal resistance in the ridge are high.

Moreover, in the ridge-type semiconductor laser element using the Ti/Pt/Au structure in the first electrode, coverage of the side surface in the ridge X-direction (direction orthogonally intersecting the optical axis) by the insulation film greatly affects the reliability. For example, an insulation film of silicon oxide or the like has a barrier effect against diffusion of the Au. Accordingly, when the ridge X-direction side surface is completely covered with an insulation film, it is possible to prevent diffusion of Au coming into the ridge from the Au film of the first electrode through the ridge side surface even if the Ti film coverage at the ridge side surface is incomplete. However, when the ridge X-direction side surface is not covered completely, Au is diffused into the ridge from the Au film if the Ti film coverage at the ridge side surface is incomplete. Since Au is easily diffused with respect to crystal, the Au introduced into the ridge is further diffused with lapse of time and reaches a resonance region (light emission unit) arranged at a portion of the active layer immediately below the ridge. Since the diffusion region where Au is diffused absorbs light, the Au coming into the resonance region lowers ratio of conversion from current to light.

The Ti film is formed, for example, by deposition. Such a Ti film has a worse coverage at the ridge side surface as compared to the flat portion and the Ti film at the ridge side surface has a small thickness. Moreover, the thickness of the Ti film at the ridge side surface becomes thinner because of the production irregularities and process trouble.

Consequently, it is necessary to completely cover the ridge X-direction side surface with an insulation film. Especially Au is easily diffused into an InP layer than an InGaAs layer. Accordingly, the X-direction side surface of the third clad layer formed by InP should be covered completely with an insulation film.

SUMMARY OF THE INVENTION

It is therefore an object of the present invention to provide a semiconductor laser element capable of reducing the contact resistance and thermal resistance and having a high reliability.

Another object of the present invention is to provide a semiconductor laser device capable of reducing the contact resistance and thermal resistance and having a high reliability.

Still another object of the present invention is to provide a novel semiconductor laser element and a semiconductor laser device having a high reliability.

The aforementioned and other objects and novel characteristics of the present invention will be clear by the description of the present Specification and the attached drawings.

Among the inventions disclosed in this application, representative ones may be outlined as follows.

Scheme (1)

A semiconductor laser element according to the present invention comprises: a semiconductor substrate, an active layer formed on the semiconductor substrate, a ridge having a clad layer formed on the active layer and a contact layer formed on the clad layer, an insulation film covering the side surfaces of the clad layer, and an electrode connected to the contact layer, wherein the insulation layer has an end portion in the ridge thickness direction located between the upper surface and the lower surface of the contact layer.

Scheme (2)

A semiconductor laser device (semiconductor laser module) according to the present invention comprises a semiconductor laser element including: a semiconductor substrate, an active layer formed on the semiconductor substrate, a ridge having a clad layer formed on the active layer and a contact layer formed on the clad layer, an insulation film covering the side surfaces of the clad layer, and an electrode connected to the contact layer, wherein the insulation layer has an end portion in the ridge thickness direction located between the upper surface and the lower surface of the contact layer.

Scheme (3)

A semiconductor laser element manufacturing method according to the present invention comprises: (a) a step of forming a plurality of semiconductor layers on a semiconductor substrate, (b) a step forming a first semiconductor layer on the plurality of semiconductor layers, (c) a step of forming a contact layer consisting of a second semiconductor layer on the plurality of semiconductor layers, (d) a step of selectively removing a portion of the contact layer, (e) a step of selectively removing a portion of the first semiconductor layer, wherein the upper surface of the contact layer has a first direction width greater than a first direction width of the first semiconductor layer after the step (c).

Scheme (4)

A semiconductor laser element manufacturing method as disclosed in scheme (3), further comprises after step (c): (f) a step of forming an insulation film on the semiconductor substrate, and (g) a step of removing the insulation film from the contact layer.

Scheme (5)

A semiconductor laser element manufacturing method as disclosed in scheme (4), further comprises after step (e): (h) a step of forming an electrode from Au which is electrically connected to the contact layer.

Scheme (6)

A semiconductor laser element manufacturing method as disclosed in scheme (5), wherein after the step (e), the insulation film remains on the side walls of the plurality of semiconductor layers and on the side walls of the contact layer.

Scheme (7)

A semiconductor laser element manufacturing method as disclosed in scheme (3), wherein after the step (c), the upper surface of the contact layer has a width in a first direction greater than a width of the lower surface of the contact layer in the first direction.

Scheme (8)

A semiconductor laser element manufacturing method as disclosed in scheme (4), wherein step (a) includes: (a1) a step of forming an n-type clad layer on the semiconductor substrate, (a2) a step of forming an active layer on the n-type clad layer, and (a3) a step of forming a first p-type clad layer on the active layer.

Scheme (9)

A semiconductor laser element manufacturing method as disclosed in scheme (8), wherein the first semiconductor layer in step (b) is a second p-type clad layer.

Scheme (10)

A semiconductor laser element manufacturing method as disclosed in scheme (3), wherein the contact layer is formed from InGaAs, the first semiconductor layer is formed from InP, in step (d), the wet etching method is performed by using an etching solution containing 1% or more of $H_3PO_4$, $H_2O_2$, and in step (e), the wet etching is performed by using an etching solution capable of taking a selection ratio with respect to the contact layer.

Scheme (11)

A semiconductor laser element manufacturing method as disclosed in scheme (3), wherein the first semiconductor layer has a ridge shape.

Scheme (12)

A semiconductor laser element comprises:

a plurality of semiconductor layers formed on a semiconductor substrate, a ridge having a first semiconductor layer formed on the plurality of semiconductor layers and a contact layer formed on the first semiconductor layer, an insulation film covering the side surfaces of the ridge in a first direction, and an electrode connected to the contact layer, wherein the upper surface of the contact layer has a width in the first direction greater than a width of the lower surface of the contact layer in the first direction.

Scheme (13)

A semiconductor laser element according to the present invention comprises:

a plurality of semiconductor layers formed on a semiconductor substrate, a ridge having a first semiconductor layer formed on the plurality of semiconductor layers and a contact layer formed on the first semiconductor layer, an insulation film covering the side surfaces of the ridge in a first direction, and an electrode connected to the contact layer, wherein the upper surface of the contact layer has a width in the first direction greater than a width of the lower surface of the contact layer in the first direction and greater than a width of the first semiconductor layer in the first direction.

Other objects, features and advantages of the invention will become apparent from the following description of the embodiments of the invention taken in conjunction with the accompanying drawings.

DETAILED DESCRIPTION OF EMBODIMENTS

Figure 1:
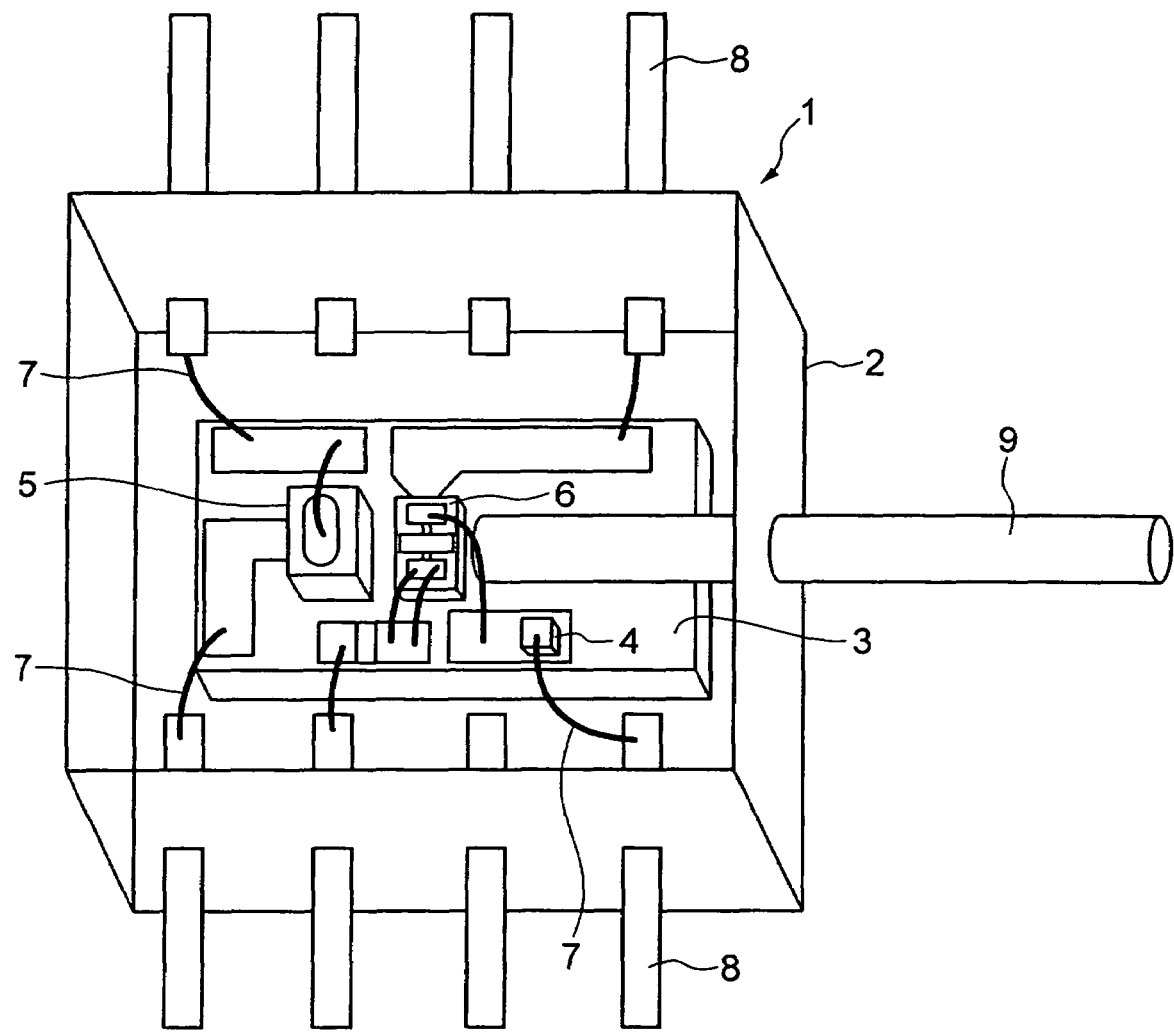
FIG. 1 is a perspective view showing an internal structure of a semiconductor laser device according to a first embodiment of the present invention.

Description will now be directed to embodiments of the present invention with reference to the attached drawings. It should be noted that like components having like functions are denoted by like reference symbols in the drawings and their explanations are given only once.

Embodiment 1

In this embodiment, explanation will be given on the present invention applied to a butterfly type semiconductor laser device.

FIG. 1 is a perspective view showing an internal structure of a semiconductor laser device according to a first embodiment of the present invention.

Figure 2:
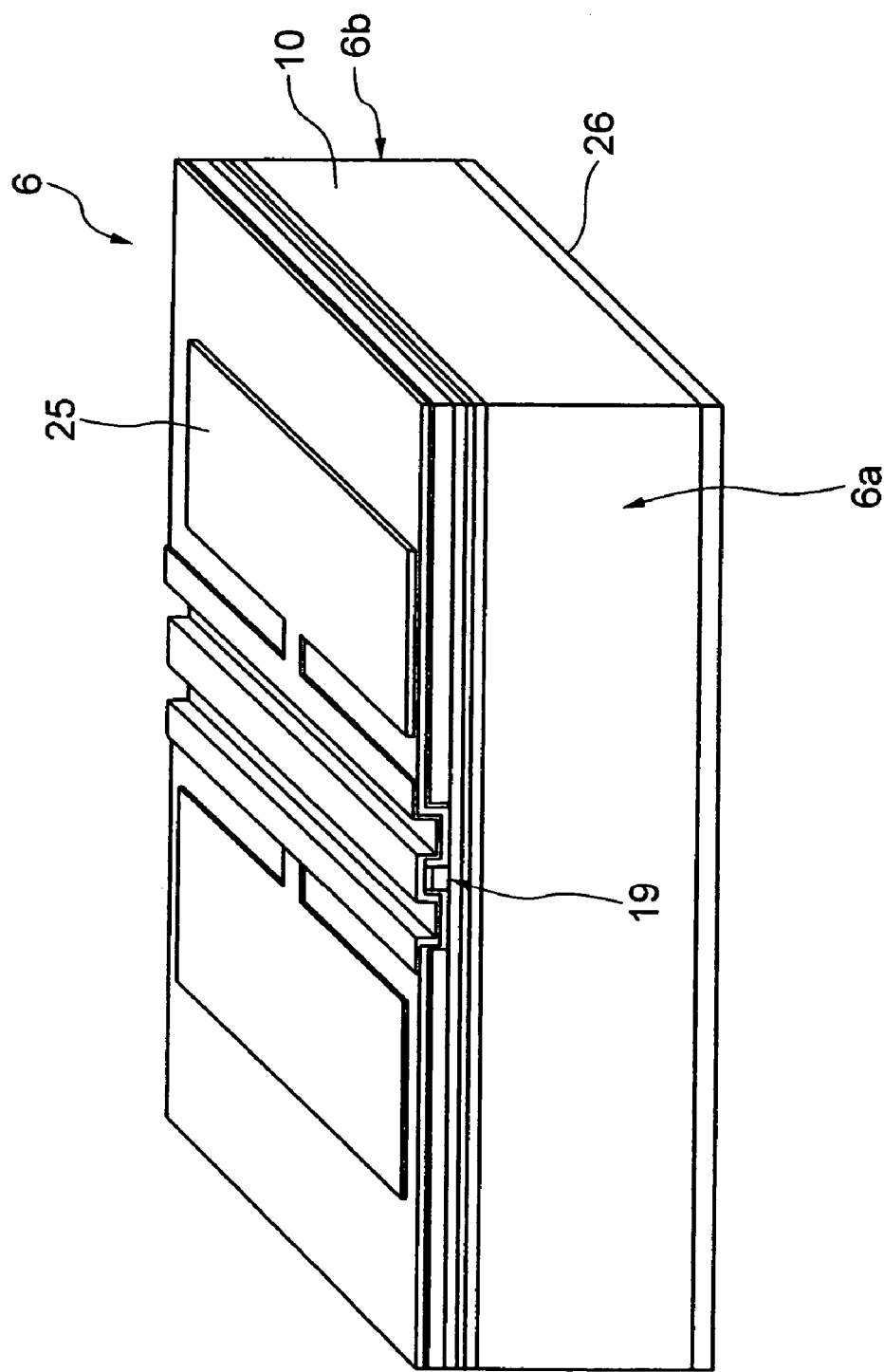
FIG. 2 is a perspective view of a semiconductor laser element to be built in a semiconductor laser device of the first embodiment.

FIG. 2 is a perspective view of a semiconductor laser element to be built in a semiconductor laser device of the first embodiment.

Figure 3:
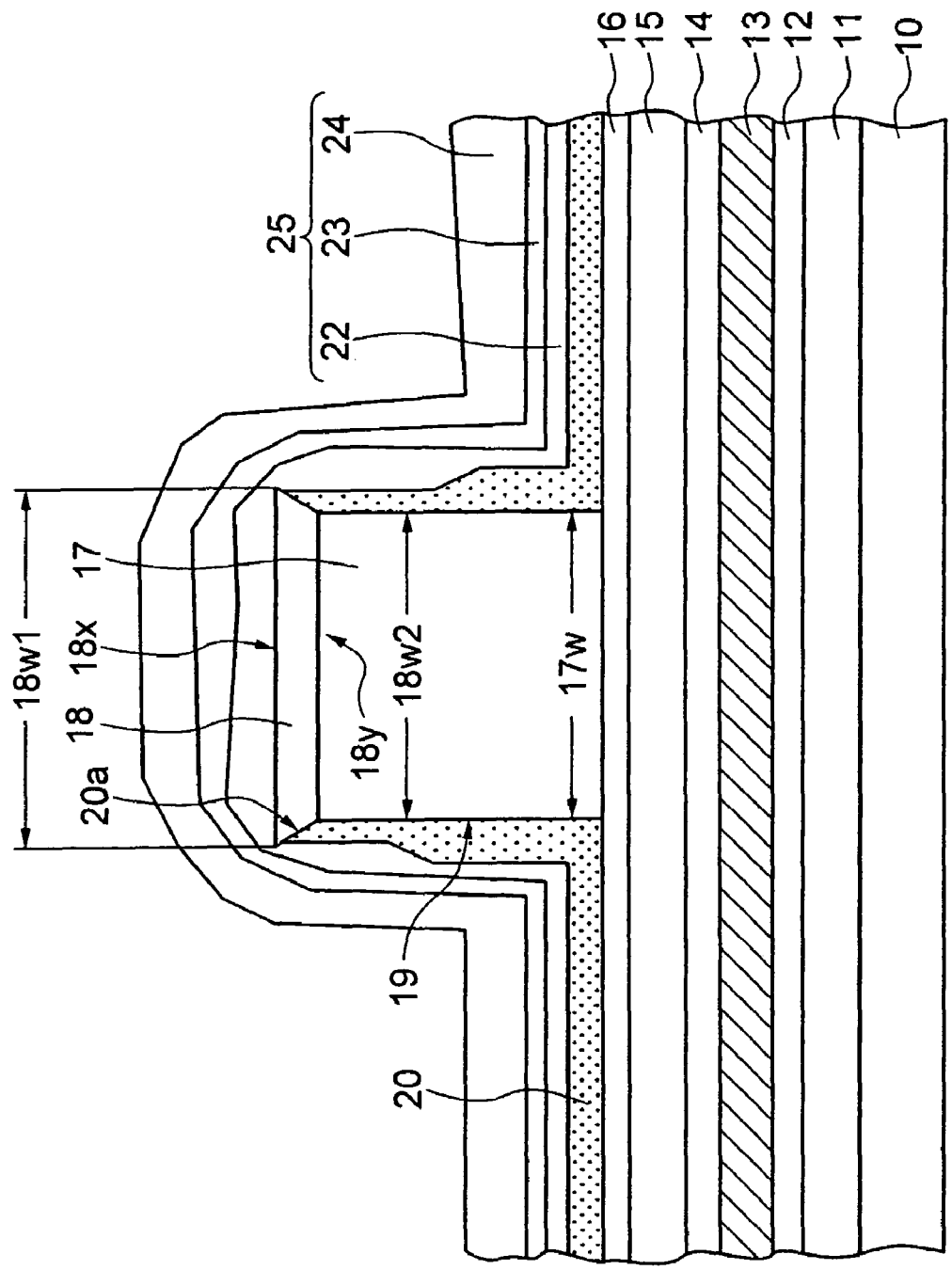
FIG. 3 is a cross sectional view of part of the semiconductor laser element to be built in the semiconductor laser device of the first embodiment.

FIG. 3 is a cross sectional view of part of the semiconductor laser element to be built in the semiconductor laser device of the first embodiment.

FIG. 4 to FIG. 10 are cross sectional views of the semiconductor laser element to be built in the semiconductor laser device of the first embodiment during manufacturing steps.

As shown in FIG. 1, the semiconductor laser device 1 includes a seal body 2, a pedestal 3, a coil element 4, a photodetective element (PD: photo diode) 5, a semiconductor laser element (LD: laser diode) 6, a plurality of bonding wires 7, a plurality of leads 8, and an optical fiber 9. The pedestal 3, the coil element 4, the photodetective element 5, and the semiconductor laser element 6, the plurality of bonding wires and the like are arranged in the seal body 2. The plurality of leads 8 and the optical fiber 9 extends inside and outside the seal body 2.

The pedestal 3 is formed mainly by a substrate made from, for example, silicon. A plurality of wires are formed on the main surface of the pedestal 3 and a groove is formed on the main surface for positioning of the optical fiber 9.

The coil element 4, the photodetective element 5, and the semiconductor laser element 6 are arranged on the main surface of the pedestal 3. These elements have electrodes arranged, for example, on the main surface and the rear surface. The electrodes of these elements on the main surface are electrically connected to a corresponding wire or a lead 8 of the pedestal 3 via a bonding wire 7 while the electrodes of these elements on the rear surface are electrically connected to a corresponding wire of the pedestal 3 via a conductive adhesive material. Moreover, each wire of the pedestal 3 is electrically connected to a corresponding lead 9 via the bonding wire 7.

As shown in FIG. 2 and FIG. 3, the semiconductor laser element 6 includes a first clad layer 11 made from InAlAs, an SCH (separate confinement heterostructure) layer 12 made from InGaAlAs, an active layer 13 made from InGaAlAs, an SCH layer 14 made from InGaAlAs, a second clad layer 15 made from InAlAs, and an etching stop layer 16 made from InGaAlAs which are successively formed on the main surface of a semiconductor substrate 10 made from a compound semiconductor such as InP.

A stripe-shaped ridge 19 is arranged on the etching stop layer 16 on the active layer 13. The ridge 19 has a third clad layer 17 arranged on the etching stop layer 16 and a contact layer 18 arranged on the third clad layer 17. The third clad layer 17 is formed, for example, from InP and the contact layer is formed, for example, from InGaAs.

As shown in FIG. 3, in this embodiment, the upper surface 18x of the contact layer 18 has width 18w1 (width in the same direction as the direction (Y direction) intersecting the longitudinal direction (X direction) of the ridge or the optical axis) which is greater than a width 18w2 (width of the same direction as the Y direction) of the lower surface 18y.

On the etching stop layer 16 above the active layer 13, an insulation film 20 formed from, for example, silicon oxide ($SiO_2$) is arranged to cover the two sides of the ridge 19 (two sides located at opposing positions in the Y direction) and the etching stop layer 16 at both sides of the ridge 19.

On the ridge 19, the contact layer 18 has the upper surface 18x entirely exposed from the insulation film 20 (not covered by the insulation film) while the side surfaces of the third clad layer 17 are completely covered by the insulation film 20. The insulation film 20 has an end portion 20a located between the upper surface 18x and the lower surface 18y of the contact layer 18.

On the insulation film 20, an electrode (anode electrode, for example) 25 is arranged so as to cover the ridge 19. The electrode 25 on the ridge 19 is electrically connected to the contact layer 18. The electrode 25, for example, has a structure having a Ti film 22, a Pt film 23, and an Au film 24 successively formed on the insulation film 20. The Ti film 22 is arranged, for example, so as to suppress diffusion of atoms of the Au film 24 into the third clad layer 17 of the ridge 19. The Pt film is arranged, for example, so as to increase attachment between the Ti film 22 and the Au film 24. The Au film 24 is arranged, for example, so as to suppress oxidization and increase conductivity.

On the rear surface of the semiconductor substrate 10 opposite to the main surface, there is provided an electrode (cathode electrode, for example) 26 electrically connected to the semiconductor substrate 10.

The semiconductor laser element 6 is cut vertically with respect to the longitudinal direction of the ridge 19 and, as shown in FIG. 2, has a cleavage plane 6a and a cleavage plane 6b opposing to each other. Although not depicted, the surface of the end face 6a is covered with a film of low reflectivity or a high reflectivity and the surface of the end face 6b is covered with a film of a high reflectivity.

The semiconductor laser element 6 has a light emitting portion (resonance region) configured in the portion of the active layer 13 below the ridge 19. When a predetermined voltage is applied to the electrode 25 and the electrode 26, most of the current flows through the ridge 19 into the light emitting portion below the ridge 19. The electric energy of this current is converted into light by the light emitting portion of the active layer 13 and is resonated by the cleavage planes 6a and 6b. The light is output as a laser light from the cleavage plane 6a.

Here, in order to assure reliability of the InP-based ridge-type semiconductor laser element 6, the coverage of the insulation film 20 on the side surfaces of the ridge 19 is important. It is necessary to completely cover the side surfaces of the third clad layer 17 formed of InP. Moreover, in order to reduce the contact resistance and the thermal resistance, it is necessary to increase the contact area between the contact layer 18 and the electrode 25. In this embodiment, the insulation film 20 has an end portion 20a in the thickness direction of the ridge 19 located between the upper surface 18x and the lower surface 18y. With this configuration, it is possible to cover the side surfaces of the third clad layer 17 completely by the insulation film 20 and connect the electrode 25 with the entire area of the upper surface of the contact layer 18. Accordingly, it is possible to obtain a high reliability and reduction of the contact resistance and the thermal resistance.

Moreover, since the contact layer 18 has the upper surface 18x having a width 18w1 greater than the width 18w2 of the lower surface 18y and the width 17w of the third clad layer 17, it is possible to increase the contact area between the contact layer 18 and the electrode 25.

Next, explanation will be given on manufacturing of the semiconductor laser element 6 with reference to FIG. 4 to FIG. 10. It should be noted that firstly, a semiconductor substrate is prepared in manufacturing the semiconductor laser element. Actually, a large-size semiconductor substrate called a wafer is prepared and at the final stage of element formation, the wafer is cut into small pieces of semiconductor laser elements (semiconductor laser chips). For convenience, however, explanation will be given for manufacturing a single semiconductor laser element.

Figure 4:
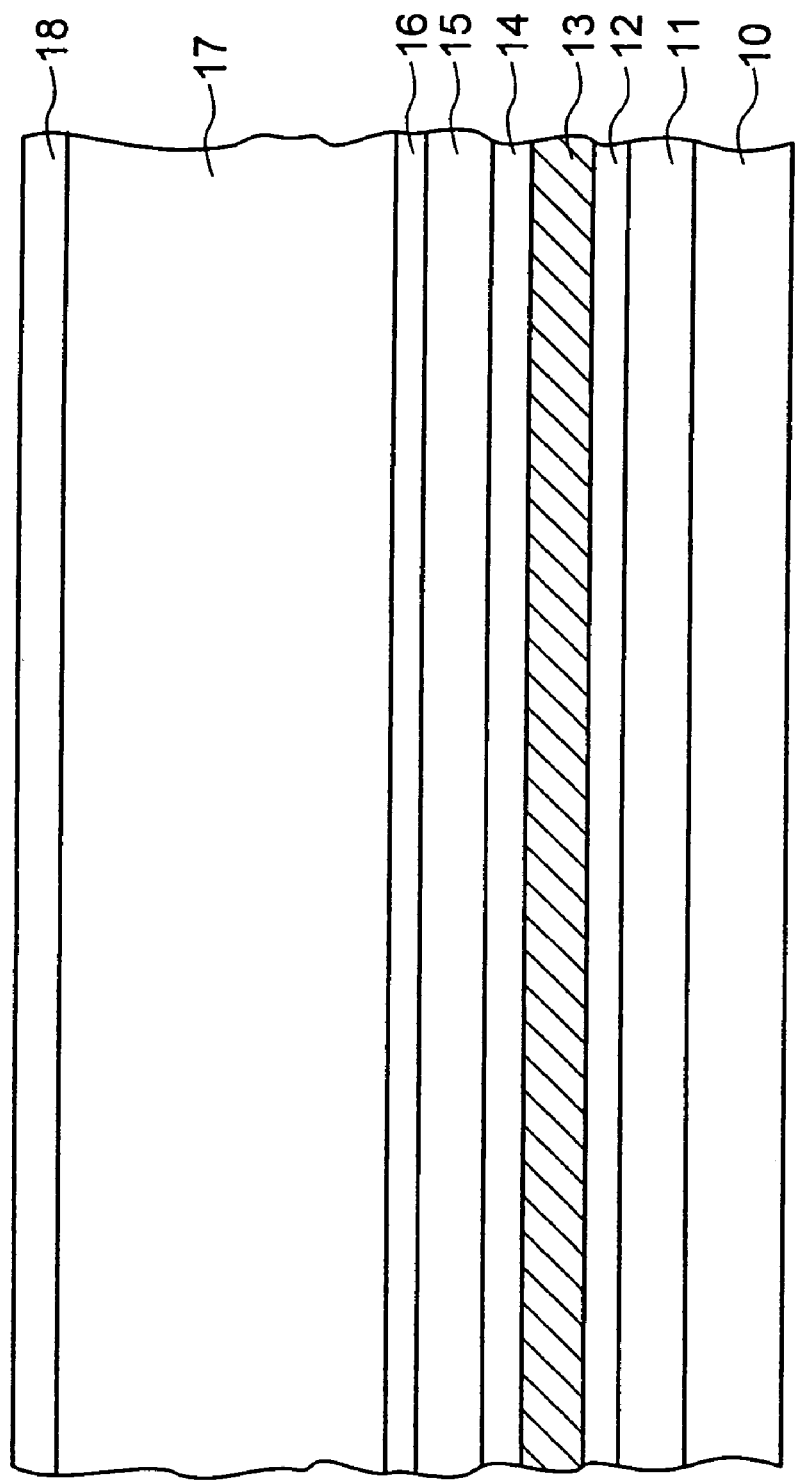
FIG. 4 is a cross sectional view of the semiconductor laser element to be built in the semiconductor laser device of the first embodiment during a manufacturing step.

Firstly, a compound semiconductor such as a semiconductor substrate 10 (hereinafter, simply referred to as a substrate) formed from InP, for example, is prepared. After this, as shown in FIG. 4, on the main surface of the substrate 10, a first clad layer 11 is formed from InAlAs, an SCH layer 12 is formed from InGaAlAs, an active layer 13 is formed from InGaAlAs, an SCH layer 14 is formed from InGaAlAs, a second clad layer 15 is formed from InAlAs, an etching stop layer 16 is formed from InGaAlAs, a third clad layer is formed from InP, and a contact layer 18 is formed from InGaAs in this order. These layers are formed by the MOCVD (metalorganic chemical vapor deposition) method or the MBE (molecular beam epitaxy) method.

Figure 5:
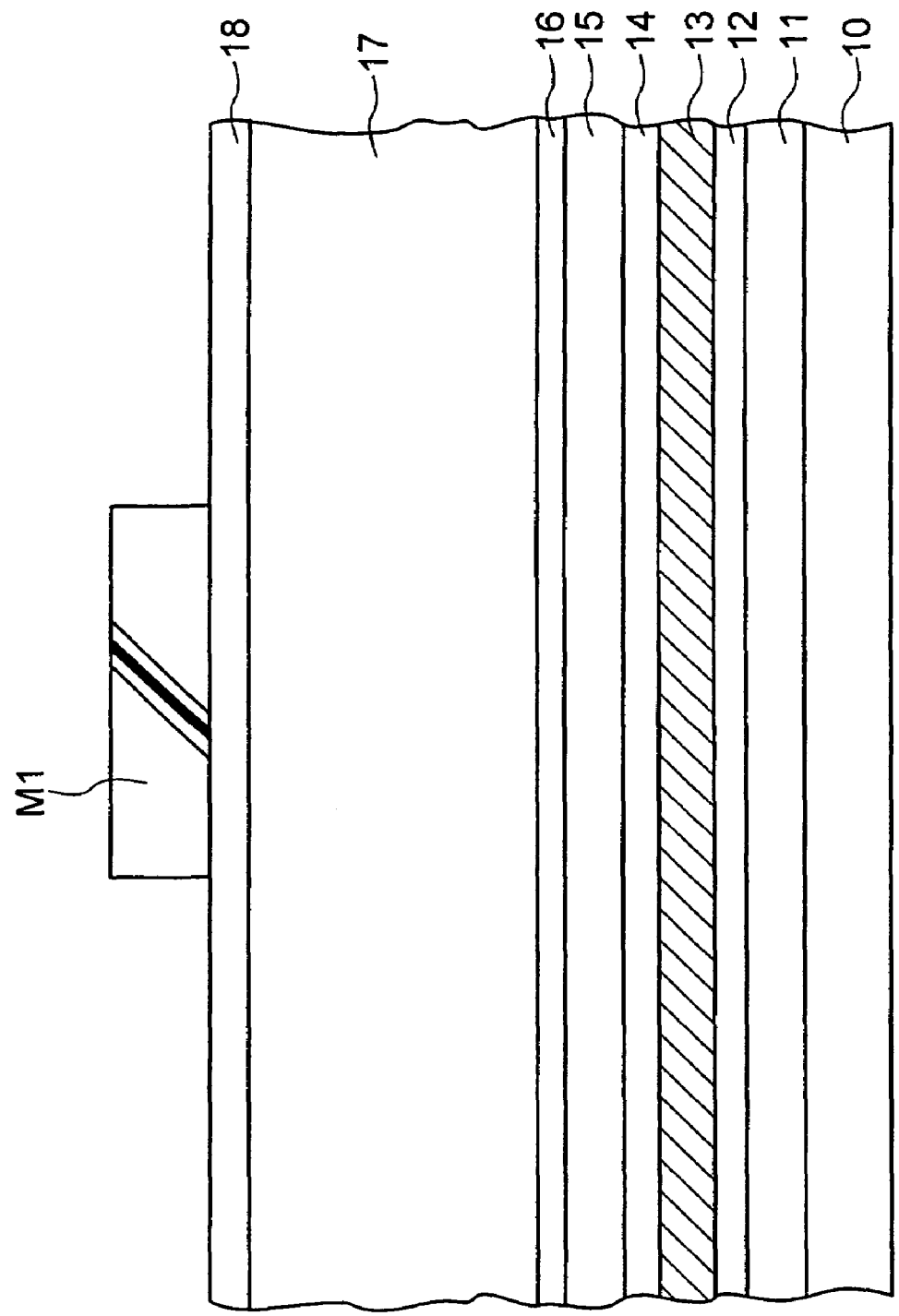
FIG. 5 is a cross sectional view of the semiconductor laser element during a manufacturing step following FIG. 4.
Figure 6:
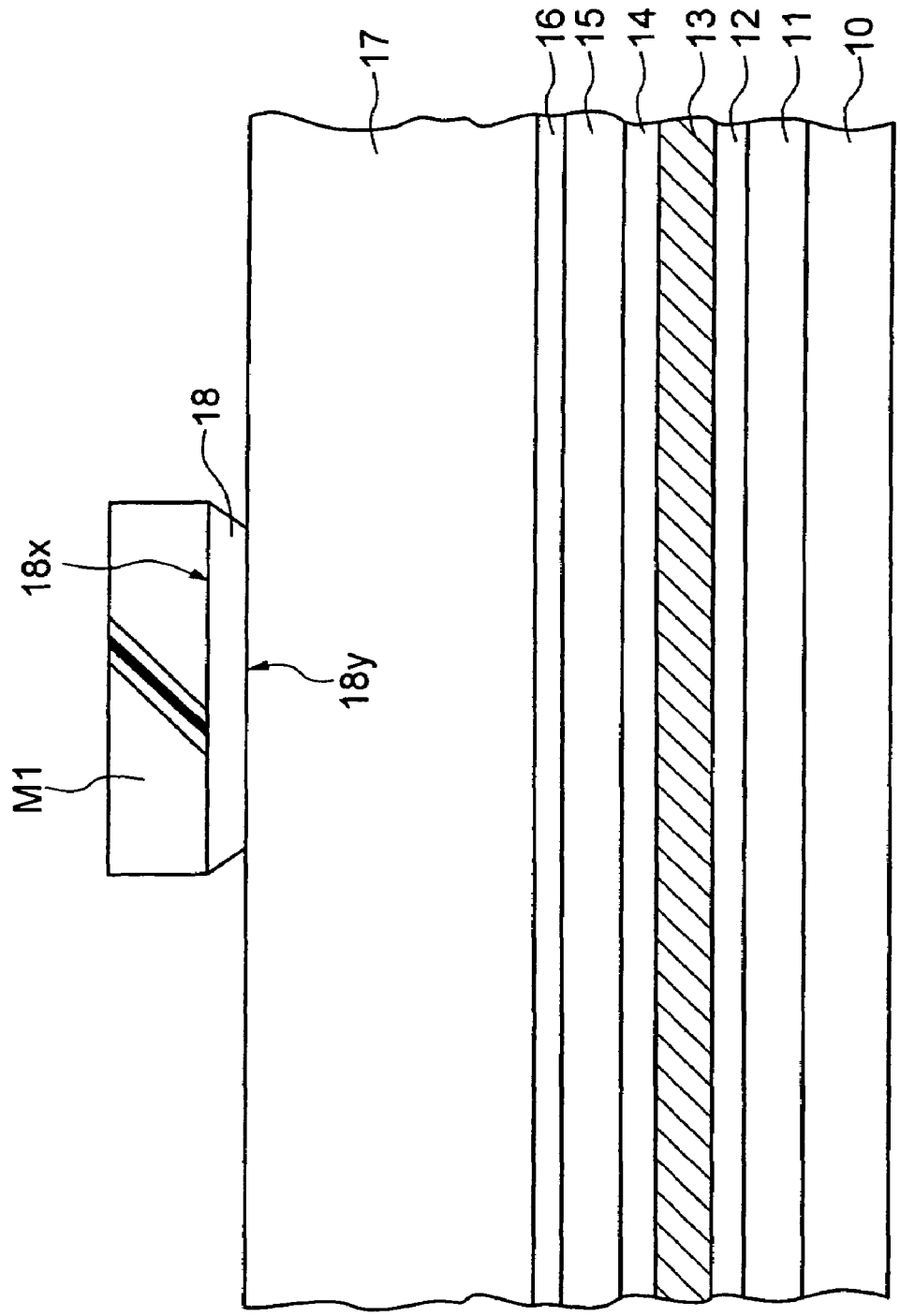
FIG. 6 is a cross sectional view of the semiconductor laser element during a manufacturing step following FIG. 5.

Next, as shown in FIG. 5, on the upper surface of the contact layer 18, a stripe-shaped mask M1 is formed by the normal photo etching technique. After this, the contact layer 18 is etched by using the mask M1 as an etching mask. As shown in FIG. 6, the etching of the contact layer 18 is performed by using the wet etching method in such a manner that the width of the upper surface of the contact layer 18 covered by the mask M1 is larger than the width of its lower surface, i.e., in the reversed mesa shape.

Figure 7:
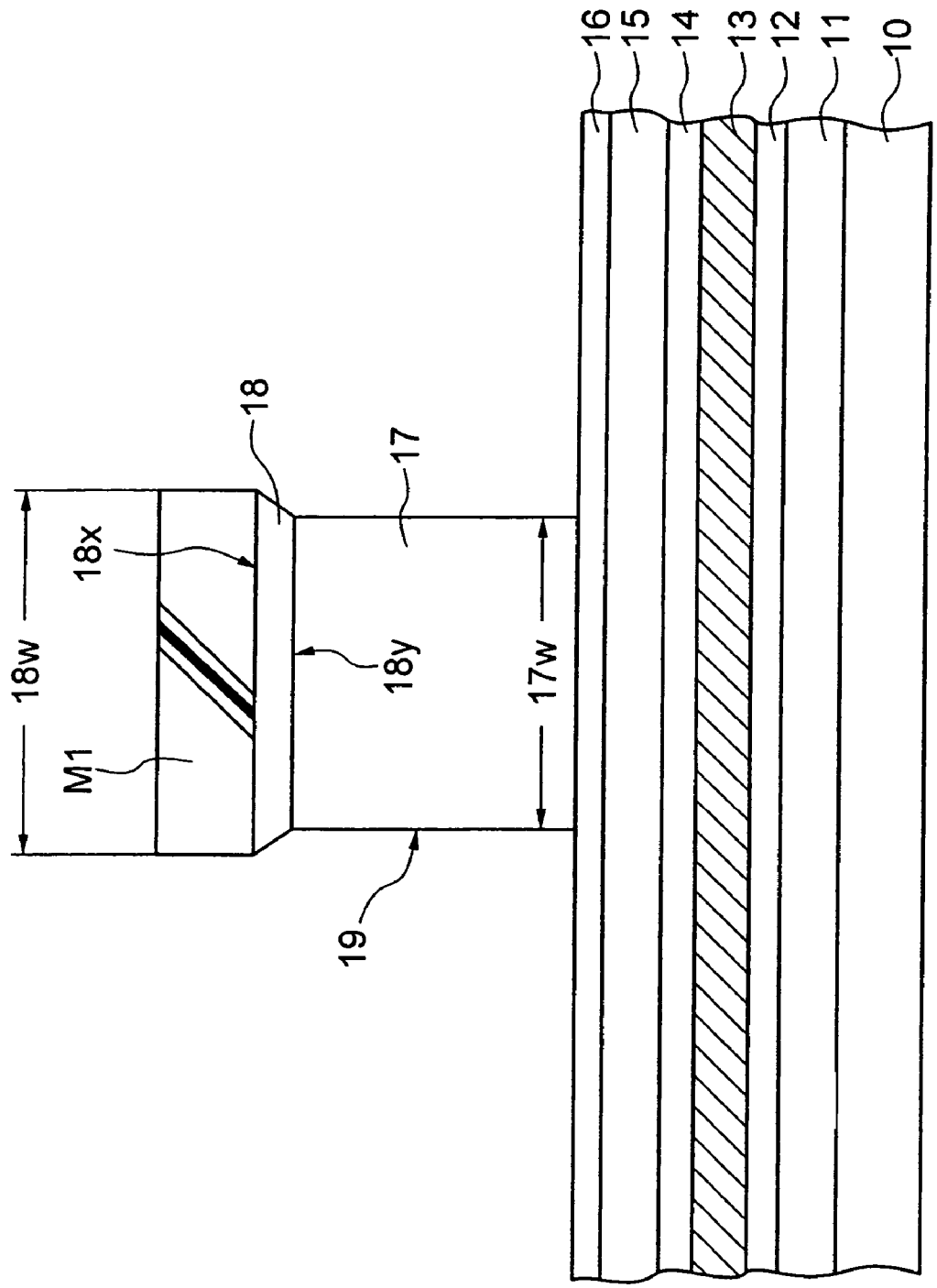
FIG. 7 is a cross sectional view of the semiconductor laser element during a manufacturing step following FIG. 6.
Figure 8:
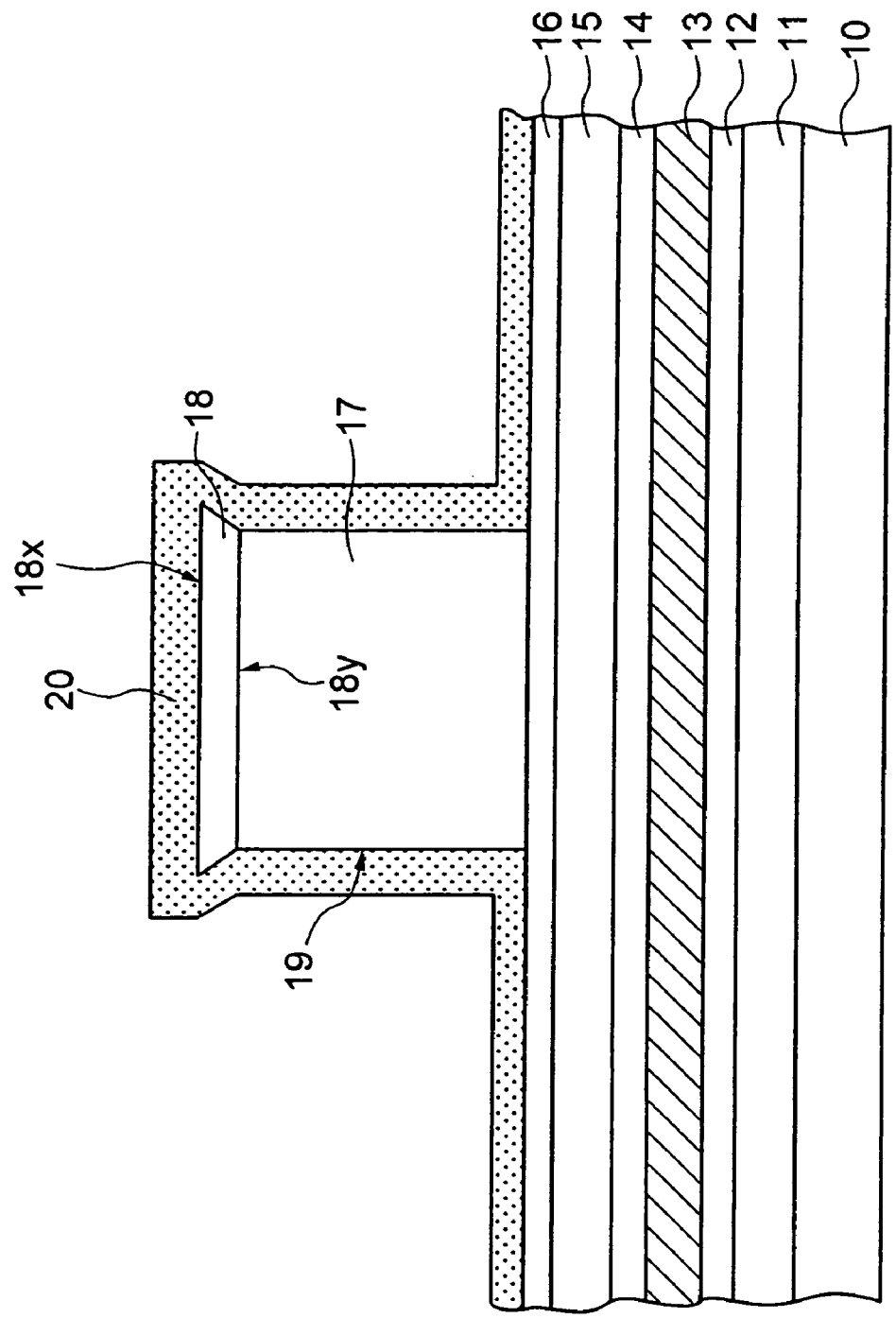
FIG. 8 is a cross sectional view of the semiconductor laser element during a manufacturing step following FIG. 7.

Next, by using the mask M1 as an etching mask, the third clad layer 17 is etched. As shown in FIG. 7, the etching of the third clad layer 17 is performed by using the wet etching method in such a manner that the width of the third clad layer 17 covered by the mask M1 is substantially identical to the width 18w2 of the lower surface 18Y of the contact layer 18 from the top to the bottom. This step forms the third clad layer 17 arranged on the etching stop layer 16 and a stripe-shaped ridge 19 having the contact layer 18 arranged on the third clad layer 17.

Next, the mask M1 is removed. Then, as shown FIG. 8, the entire surface of the etching stop layer 16 including the ridge 19 is covered by an insulation film 20 of silicon oxide formed by the CVD method. In this method, the top and sides of the ridge 19, i.e., the top and sides of the contact layer 18 and the sides the third clad layer 17 are completely covered by the insulation film 20.

Figure 9:
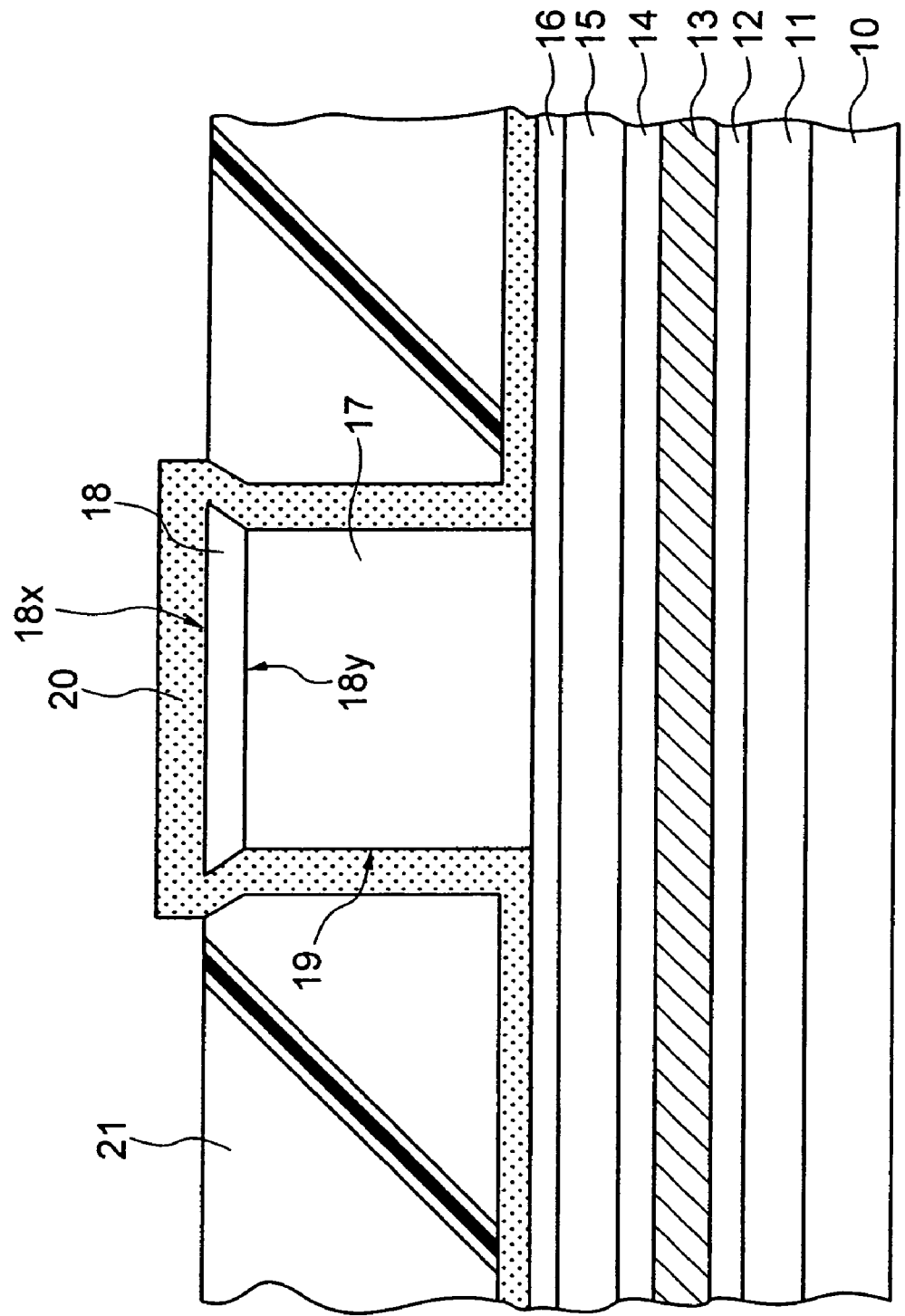
FIG. 9 is a cross sectional view of the semiconductor laser element during a manufacturing step following FIG. 8.

Next, as shown in FIG. 9, a mask 21 of resist is formed so as to cover the insulation film 20 at the both sides of the ridge 19. The formation of the mask 21 is performed by the spin coat method so as to have such a thickness that the insulation film 19 on the top of the ridge 19 is exposed.

Figure 10:
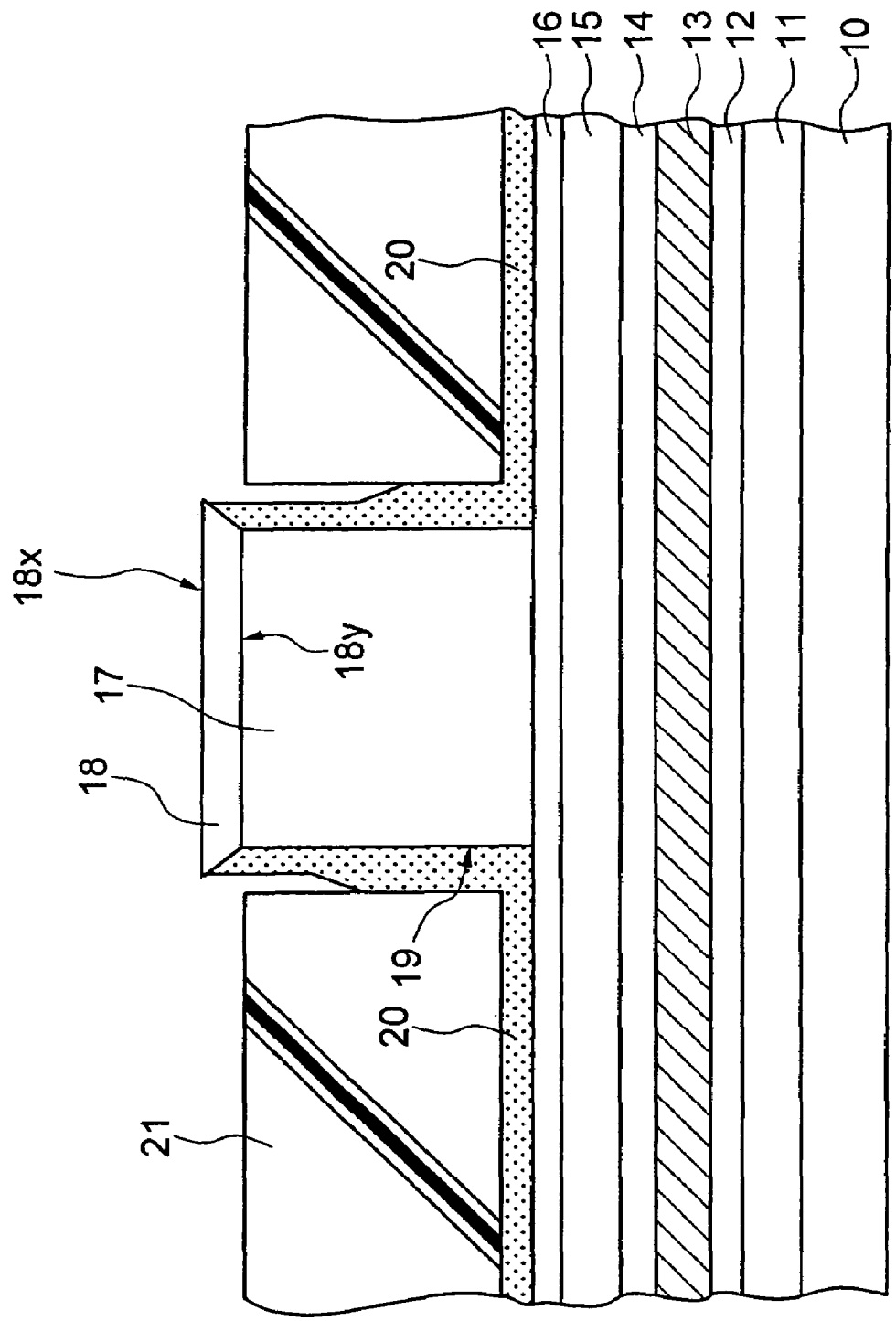
FIG. 10 is a cross sectional view of the semiconductor laser element during a manufacturing step following FIG. 9.

Next, the mask 21 is hardened. After this, as shown in FIG. 10, the insulation film 20 on the top of the ridge 19 is removed by using the anisotropic dry etching method such as RIE (reactive ion etching) with the mask 21 as an etching mask. In this step, since the contact layer 18 has the upper surface 18x having a width 18w1 larger than the width 18w2 of the lower surface 18y and the width 17w of the third clad layer 17, it is possible to remove the insulation film 20 from the top of the contact layer 18 with the end portion 20a of the insulation film 20 on the sides of the ridge 19 is located between the upper surface 18x and the lower surface 18y of the contact layer 18.

Next, the mask 21 is removed. After this, on the entire surface of the insulation film 20 including the portion on the top of the ridge 19, a Ti film 22, a Pt film, and Au film 24 are successively formed. After this, patterning is successively performed to the Au film 24, the Pt film 23, and the Ti film 22, and an electrode 25 is formed. In this step, the electrode 25 is connected to the entire area of the upper surface 18x of the contact layer 18.

Next, the rear surface of the substrate is polished to make the thickness thinner. After this, an electrode 26 is formed on the rear surface of the substrate 10. After this, thermal treatment is performed to increase the ohmic contact characteristic between the contact layer 18 and the electrode 25 and the ohmic contact characteristic between the substrate 10 and the electrode 26. After this, the substrate 10 is cut in the longitudinal direction and the lateral direction to obtain the semiconductor laser element shown in FIG. 2 and FIG. 3.

Thus, in the ridge-type semiconductor laser element 6 of the present embodiment, the end portion 20a of the insulation film 20 covering the side surfaces of the ridge 19 is located between the upper surface 18x and the lower surface 18y of the contact layer 18. Accordingly, it is possible to cover the side surfaces of the third clad layer 17 completely by the insulation film 20 and connect the electrode 25 to the entire area of the top of the contact layer 18, thereby obtaining a high reliability and reduction of the contact resistance and the thermal resistance.

Moreover, since the contact layer 18 has the upper surface 18x having the width 18w1 larger than the width 18w2 of the lower surface 18y and the width 17w of the third clad layer, it is possible to further increase the contact area between the contact layer 18 and the electrode 25.

Embodiment 2

Figure 11:
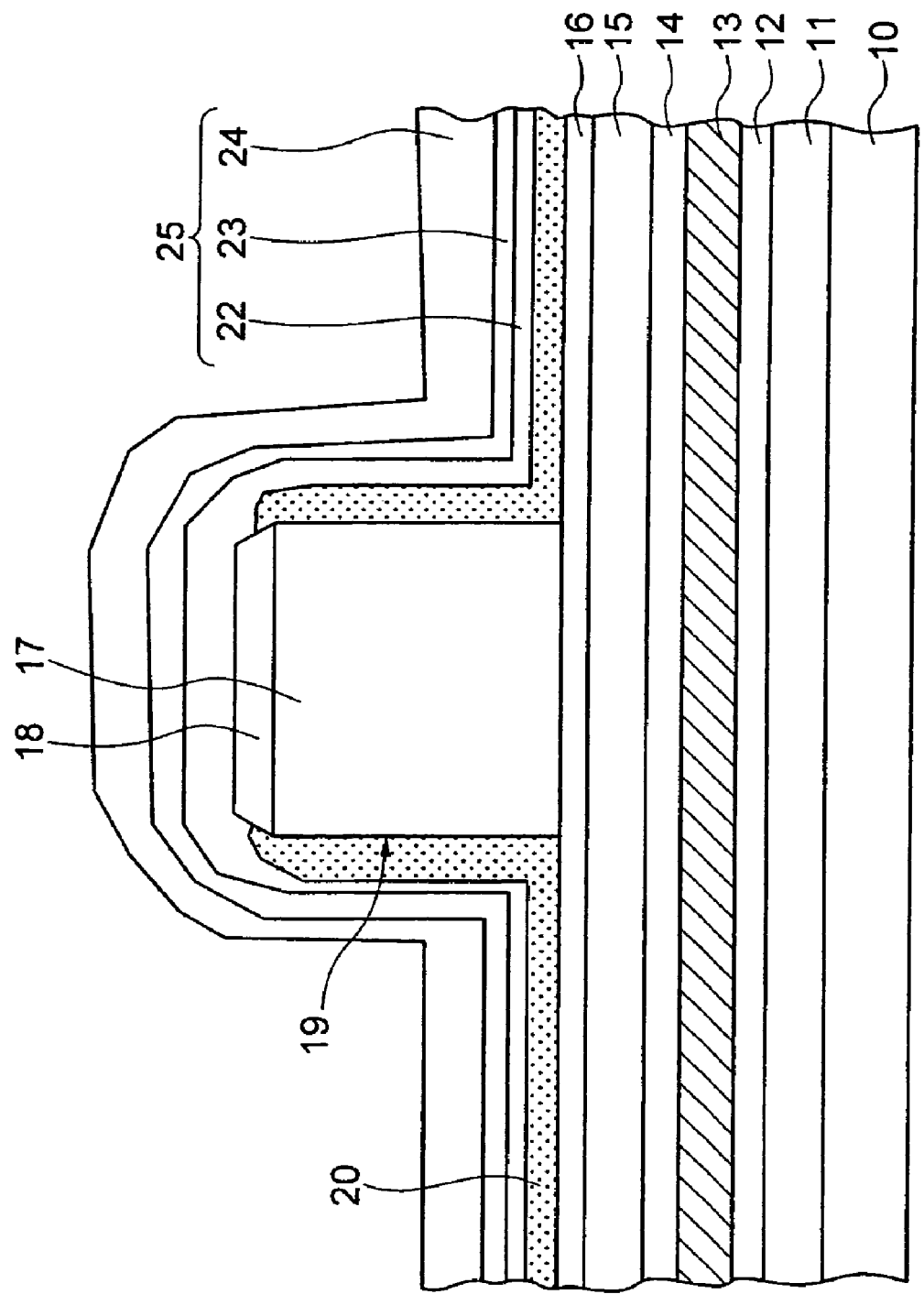
FIG. 11 is a cross sectional view of a part of a semiconductor laser element according to a second embodiment of the invention.

FIG. 11 is a cross sectional view showing a part of a semiconductor laser element of the second embodiment.

Figure 12:
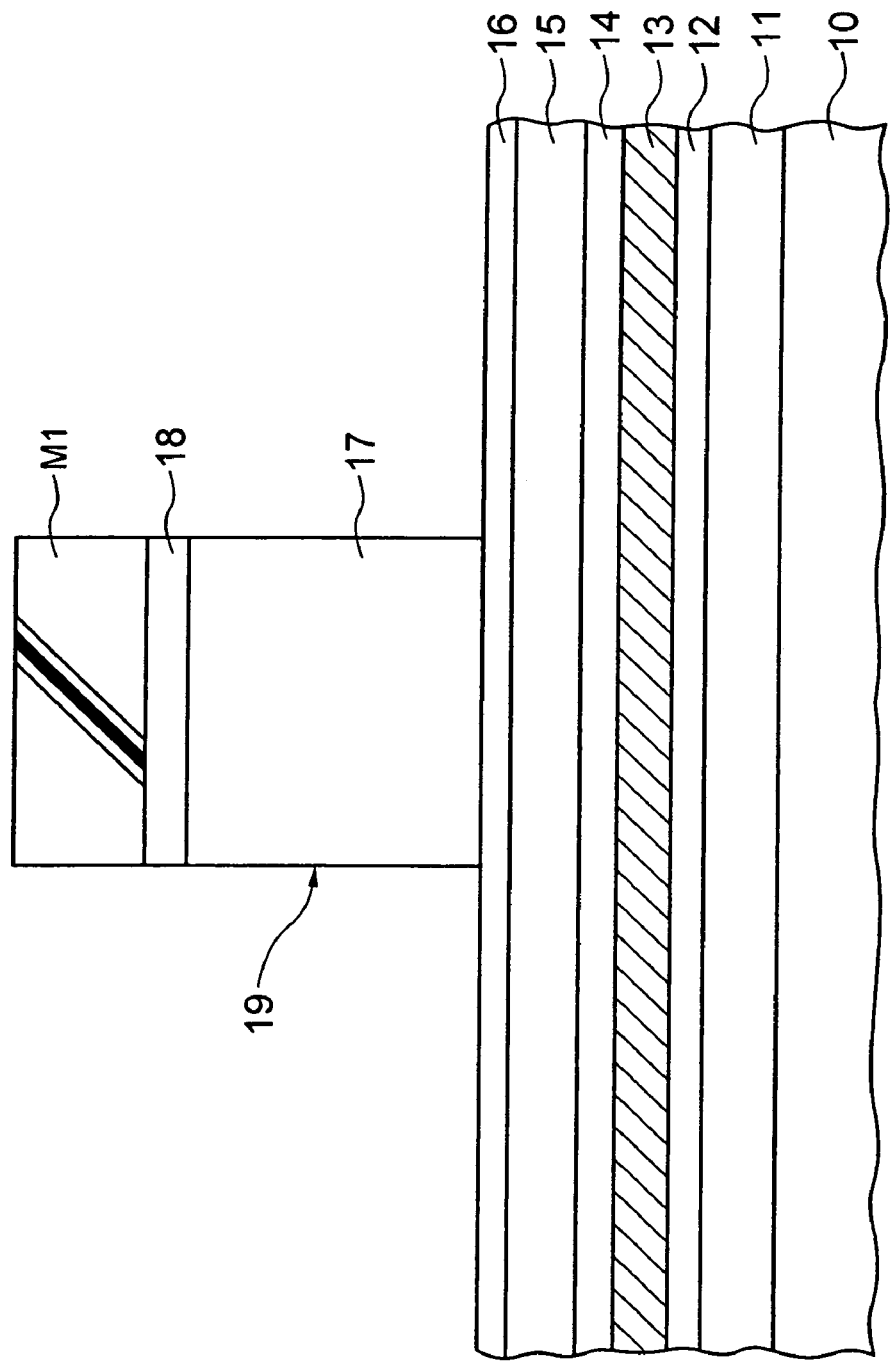
FIG. 12 is a cross sectional view of the semiconductor laser element of the second embodiment during a manufacturing step.
Figure 13:
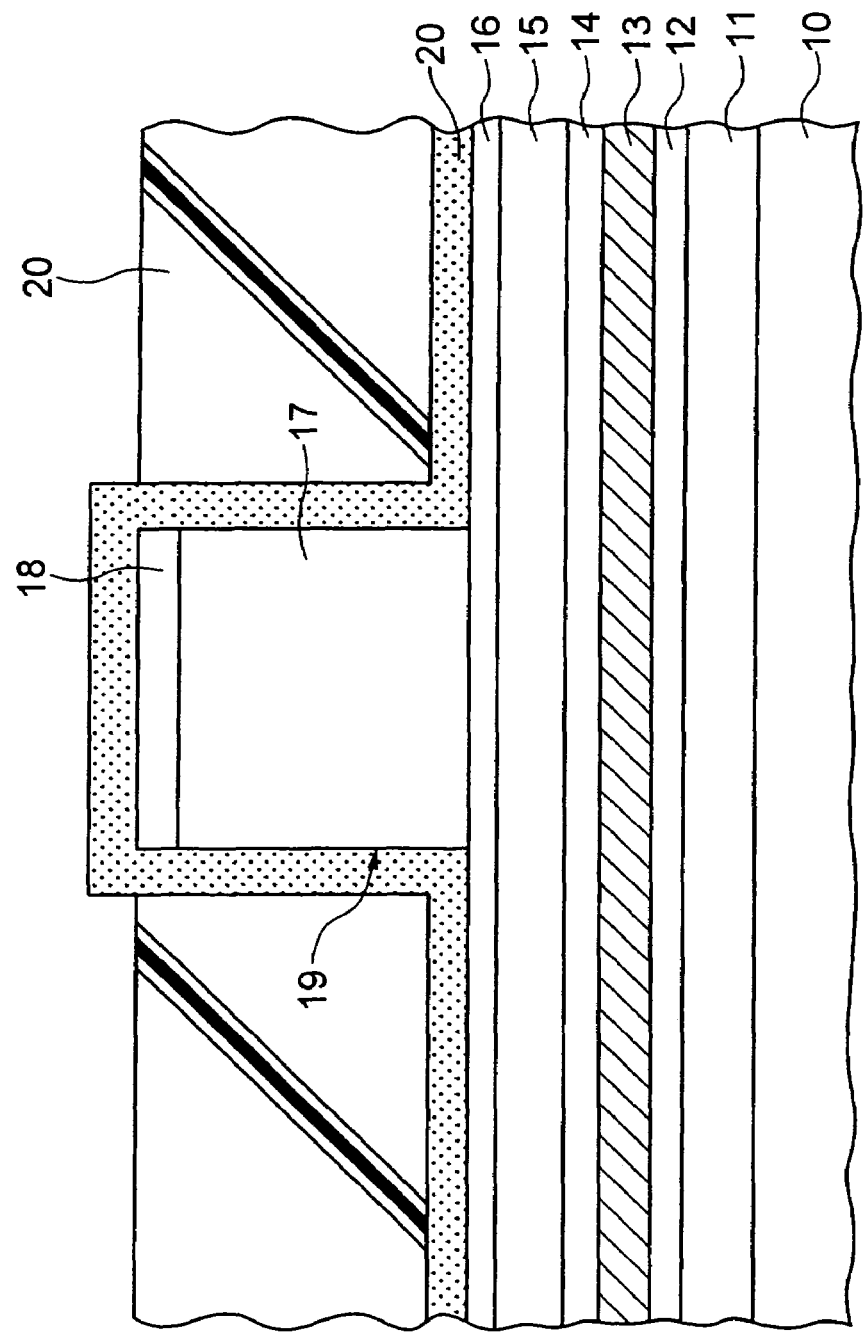
FIG. 13 is a cross sectional view of the semiconductor laser element during a manufacturing step following FIG. 12.
Figure 14:
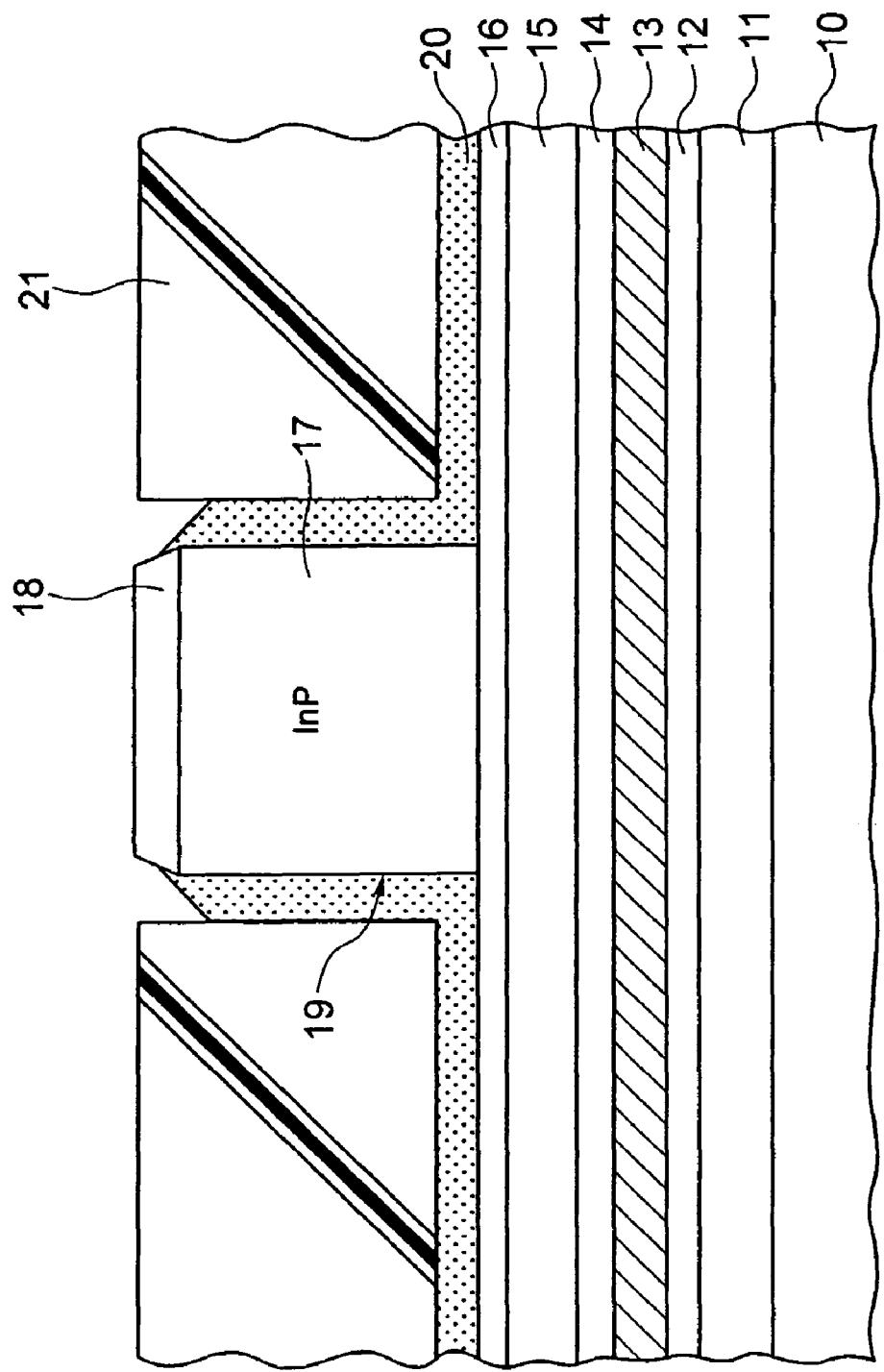
FIG. 14 is a cross sectional view of the semiconductor laser element during a manufacturing step following FIG. 13.

FIG. 12 to FIG. 14 are cross sectional views showing manufacturing steps of the semiconductor laser element of the second embodiment.

As shown in FIG. 11, the ridge-type semiconductor laser element of the second embodiment has almost identical configuration to the first embodiment but the manufacturing steps are slightly different. Hereinafter, explanation will be given on manufacturing of the semiconductor laser element of the second embodiment with reference to FIG. 12 to FIG. 14.

Firstly, similarly as in the first embodiment, on the main surface of the substrate 10, a first clad layer 11, an SCH layer 12, an active layer 13, an SCH layer 14, a second clad layer 15, an etching stop layer 16, a third clad layer 17, and a contact layer 18 are successively formed.

Next, on the top of the contact layer 18, a stripe-type mask M1 is formed by the normal photo etching technique. After this, by using this mask M1 as an etching mask, the contact layer 18 and the third clad layer 17 are successively etched.

As shown in FIG. 12, the etching of the contact layer 18 and the third clad layer 17 is performed by the wet etching method in such a manner that the width of the contact layer 18 covered by the mask M1 and the clad layer 17 up to its bottom is almost constant. By this step, a stripe-shaped ridge 19 is formed on the etching stop layer 16.

Next, the mask M1 is removed. After this, the entire surface of the etching stop layer 16 including the ridge 19 is covered by an insulation film 20 of silicon oxide, for example. After this, as shown in FIG. 13, a mask 21 of resist, for example, is formed so as to cover the insulation film 20 at both sides of the ridge 19. The formation of the mask 21 is performed by the spin coat method so as to obtain such a thickness that the insulation film 20 on the top of the ridge 19 is exposed.

Next, the mask 21 is hardened. After this, as shown in FIG. 14, the mask 21 is used as an etching mask, the insulation film 20 on the top of the ridge 19 is removed using the anisotropic dry etching method such as the RIE (reactive ion etching). In this step, the etching of the insulation film 20 is temporally controlled so that the end portion 20a of the insulation film 20 at side surfaces of the ridge 19 is located between the upper surface 18x and the lower surface 18y of the contact layer 18.

Next, the mask 21 is removed. After this, the same step as the first embodiment is performed. Thus, the ridge-type semiconductor laser element shown in FIG. 11 is formed.

In this embodiment also, the end portion 20a of the insulation film 20 covering the side surfaces of the ridge 19 is located between the upper surface 18x and the lower surface 18y of the contact layer 18. Accordingly, it is possible to cover the side surfaces of the third clad layer 17 completely by the insulation film 20 and connect the electrode 25 to the entire surface of the top of the contact layer 18, thereby obtaining a high reliability and reduction of the contact resistance and the thermal resistance.

Embodiment 3

Figure 15:
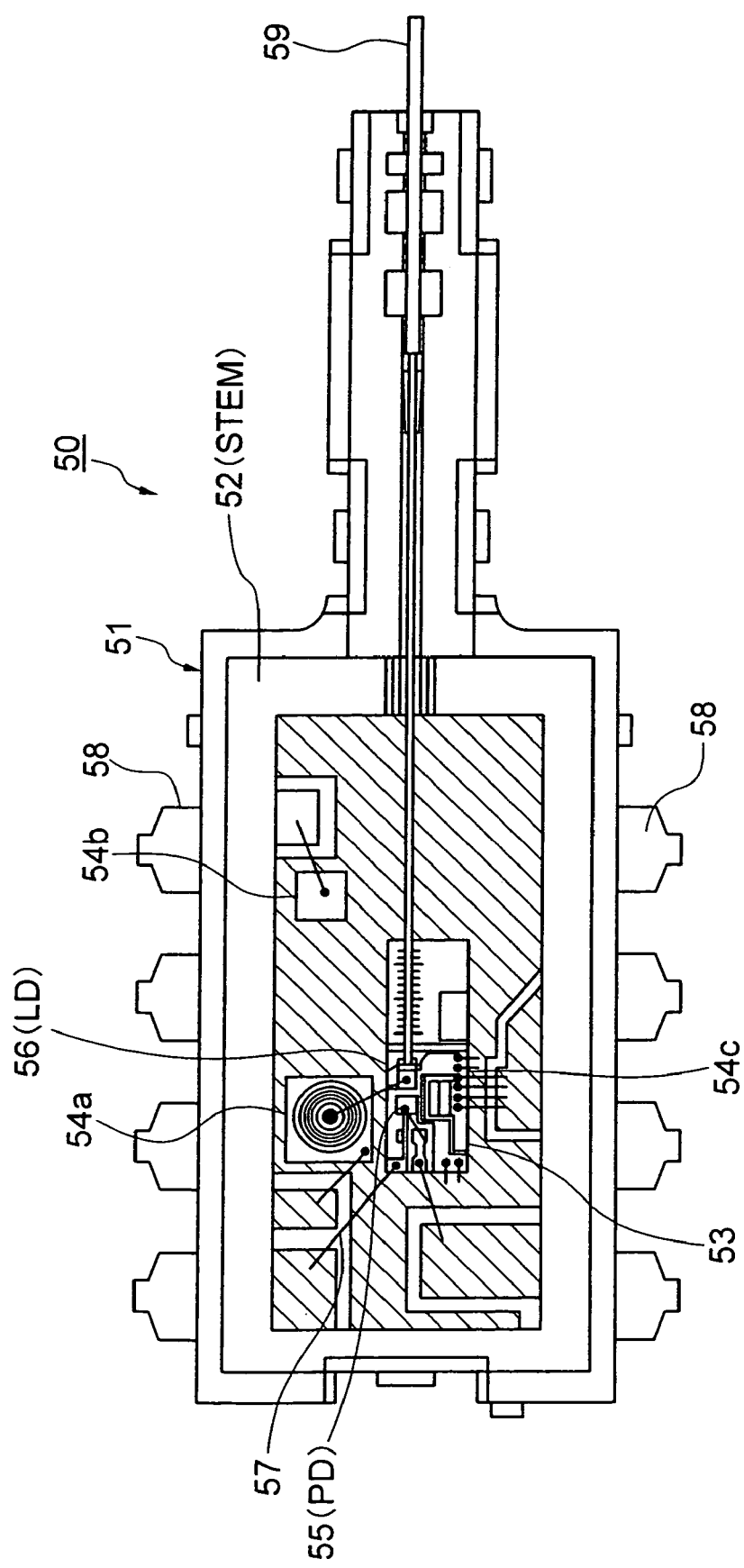
FIG. 15 is a plan view showing an internal structure of a semiconductor laser device according to a third embodiment of the present invention.

FIG. 15 is a plan view showing an internal structure of a semiconductor laser device according to the third embodiment of the present invention.

Figure 16:
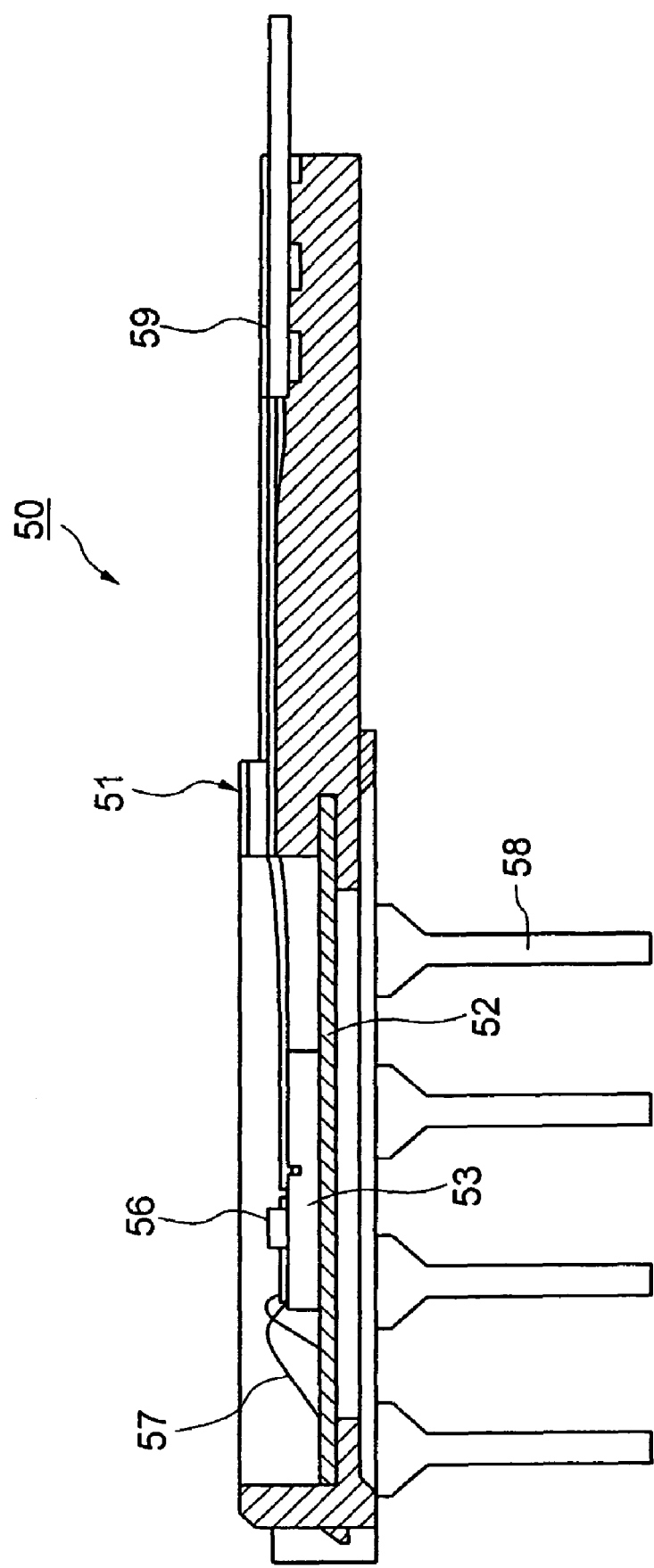
FIG. 16 is a cross sectional view showing the internal structure of the semiconductor laser device according to the third embodiment of the present invention.

FIG. 16 is a cross sectional view showing the internal structure of the semiconductor laser device according to the third embodiment of the present invention.

Figure 17:
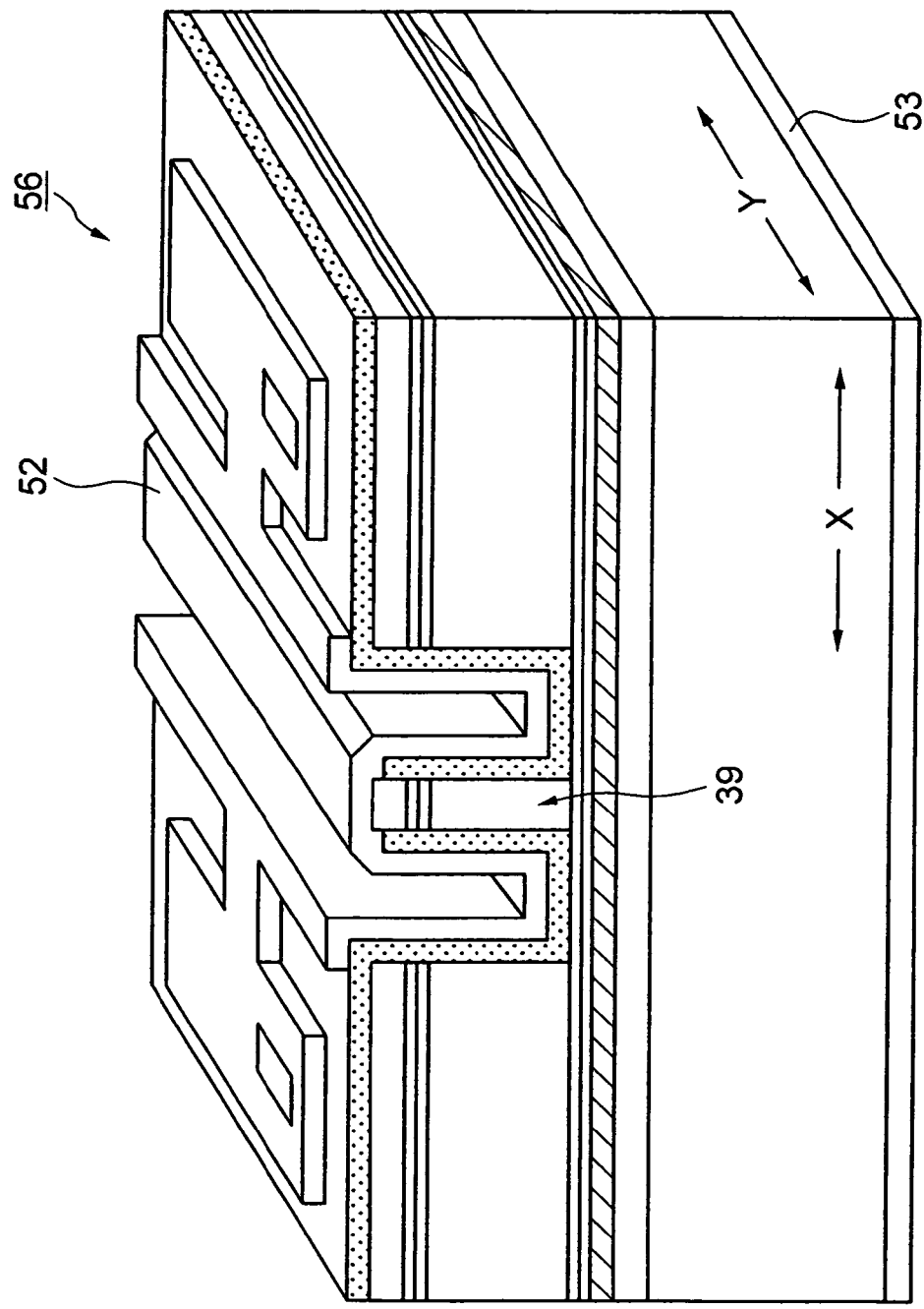
FIG. 17 is a perspective view of a semiconductor laser element to be built in the semiconductor laser device of the third embodiment.

FIG. 17 is a perspective view of a semiconductor laser element to be built in the semiconductor laser device of the third embodiment.

Figure 18:
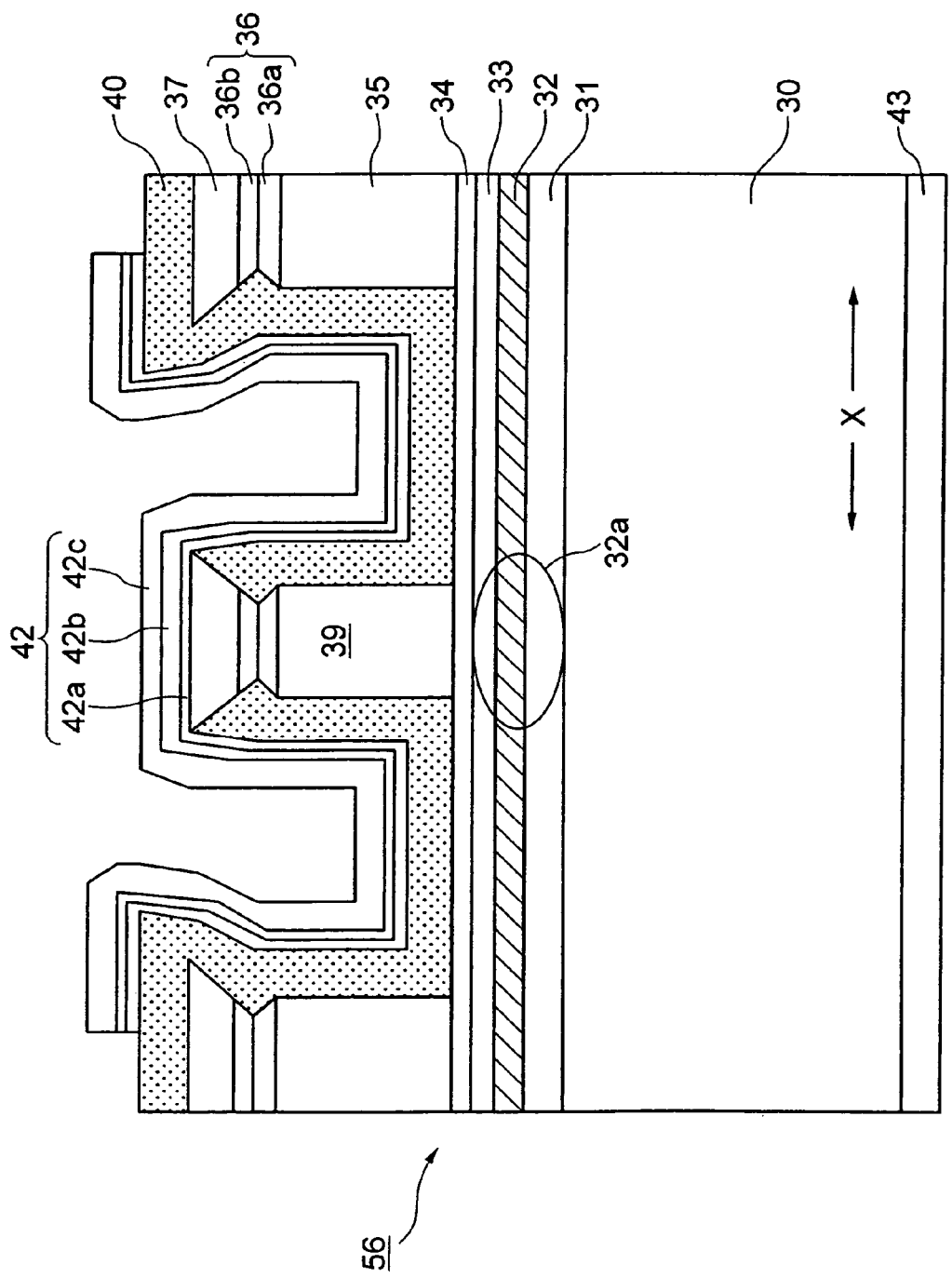
FIG. 18 is a cross sectional view of an essential portion of the semiconductor laser element of FIG. 17.

FIG. 18 is a cross sectional view of an essential portion of the semiconductor laser element of FIG. 17.

Figure 19:
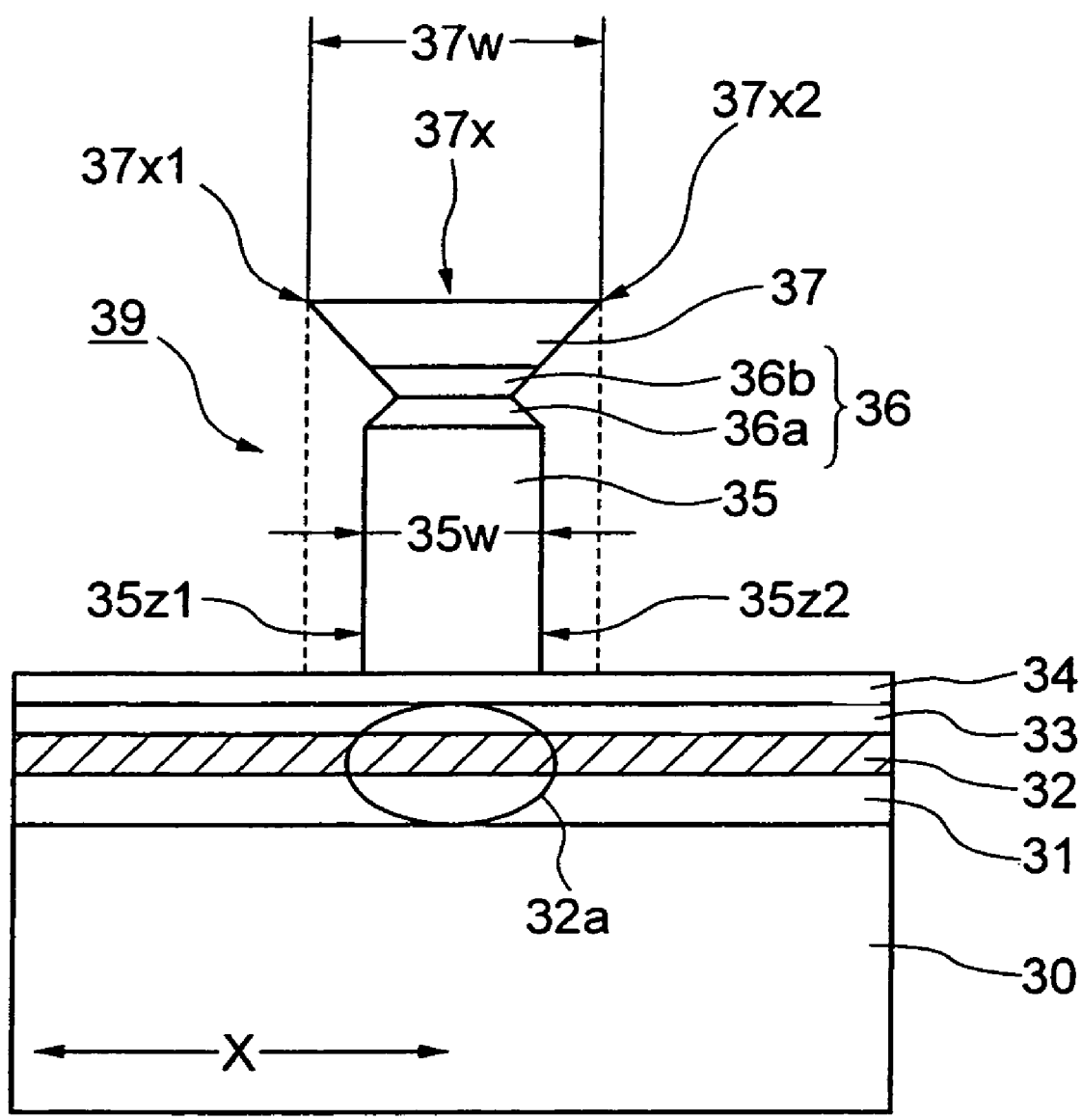
FIG. 19 is a cross sectional view of an essential portion of FIG. 18.
Figure 20A:
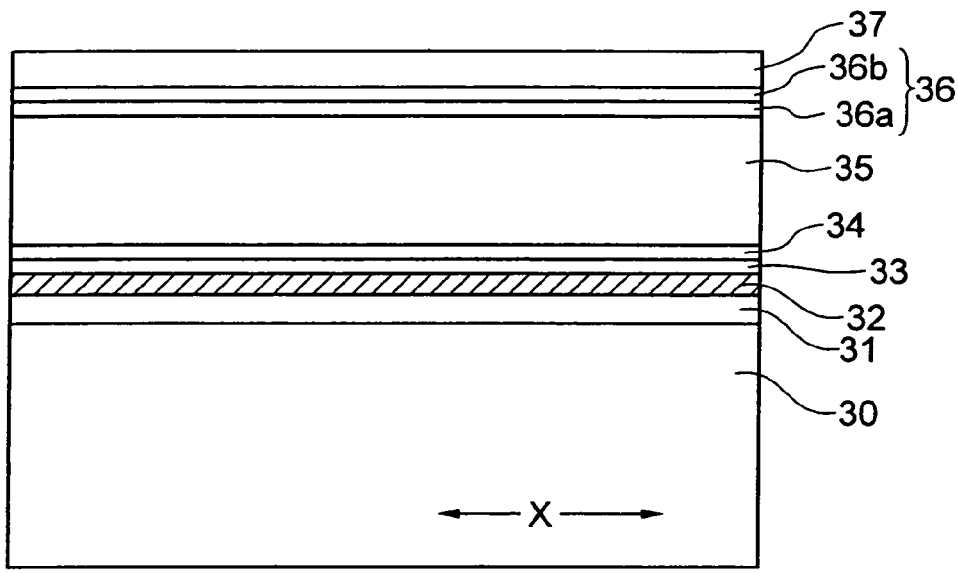
FIG. 20A is a cross sectional view of the semiconductor laser element of the third embodiment during a manufacturing step and FIG. 20B is a perspective view of FIG. 20A.
Figure 20B:
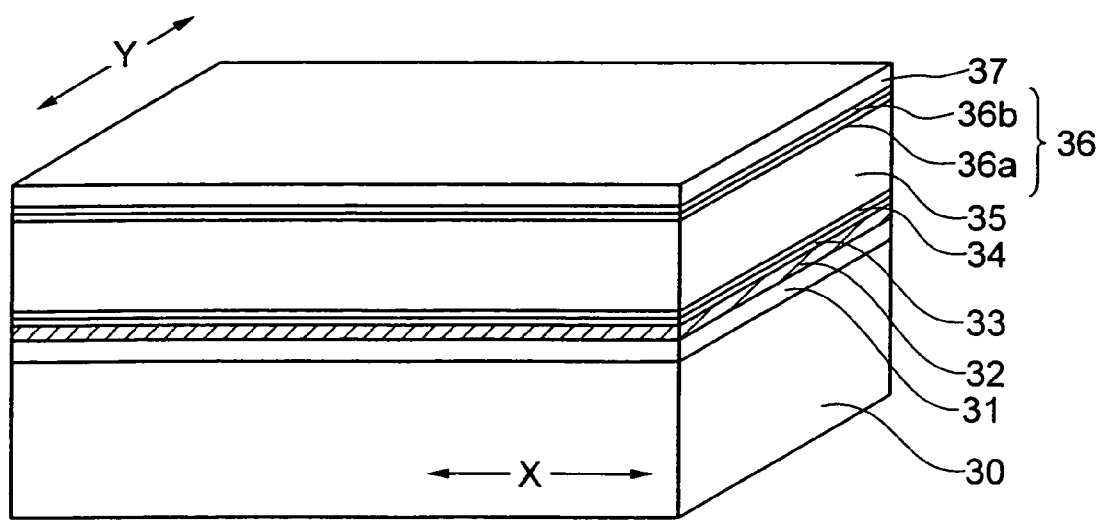

FIG. 19 is a cross sectional view of an essential portion of FIG. 18.

FIG. 20A to FIG. 28A are cross sectional views of the semiconductor laser element of the third embodiment during manufacturing steps. FIG. 20B to FIG. 28B are perspective views of FIG. 20A to FIG. 28A.

As shown in FIG. 15 and FIG. 16, the semiconductor laser device 50 includes a seal body (package main body) 51, a stem 52, a pedestal 53, a chip-type inductor 54a a chip-type thermistor 54b, a chip-type resistor element 54c, a photodetective element (PD) 55, a semiconductor laser element (LD) 56, a plurality of bonding wires 57, a plurality of leads 58, a primary fiber 59, and the like. The stem 52, the pedestal 53, the chip-type inductor 54a, the chip-type thermistor 54b, the chip-type resistor element 54c, the photodetective element 55, the semiconductor laser element 56, the plurality of bonding wires 57, and the like are arranged in the seal body 51 while the plurality of leads and the primary fiber 59 extend inside and outside the seal body 51.

A plurality of wires are arranged on the main surface of the stem and the pedestal 53 is attached to the main surface of the step 52.

The pedestal mainly consists of a substrate formed from silicon, for example. On the main surface of the pedestal 53, a plurality of wires are formed and a groove is further formed for positioning of the primary fiber 59.

The chip-type inductor 54a and the chip-type thermistor 54b are arranged on the main surface of the stem 52 while the photodetective element 55, the semiconductor laser element 56, and the chip-type resistor element 54c are arranged on the main surface of the pedestal 53. Each of these elements has electrodes arranged, for example, on the main surface and the rear surface so as to oppose each other. The first electrode on the main surface of the chip-type inductor 54a is electrically connected to the electrode on the main surface of the semiconductor laser element 56 via the bonding wire 57. The second electrode on the main surface of the chip-type inductor 54a is electrically connected to a corresponding wire of the step 52 via the bonding wire 57. The electrode on the rear surface of the chip-type inductor 54a is electrically connected to a corresponding wire of the stem 52 via a conductive adhesive. The electrode on the main surface of the chip-type thermistor 54b is electrically connected to a corresponding wire of the stem 52 via the bonding wire 57. The electrode on the rear surface of the chip-type thermistor 54b is electrically connected to a corresponding wire of the step 52 via a conductive adhesive. The electrode on the main surface of the chip-type resistor element 54c is electrically connected to a corresponding wire of the stem 52 via the bonding wire 57. The electrode on the rear surface of the chip-type resistor element 54c is electrically connected to a corresponding wire of the pedestal 53 via a conductive adhesive. The electrode on the main surface of the photodetective element 55 is electrically connected to a corresponding wire of the pedestal 53 via the bonding wire 57, and this wire is electrically connected to a corresponding wire of the stem 52 via the bonding wire 57. The electrode on the rear surface of the photodetective element 55 is electrically connected to a corresponding wire of the pedestal 53 via a conductive adhesive, and this wire is electrically connected to a corresponding wire of the stem 52 via the bonding wire 57. The electrode on the rear surface of the semiconductor laser element 56 is electrically connected to a corresponding wire of the pedestal 53 via a conductive adhesive, and the wire is electrically connected to a corresponding wire of the stem 52 via the bonding wire 57. Each of the wires of the stem 52 is electrically connected to a corresponding lead 58.

As shown in FIG. 17 and FIG. 18, the semiconductor laser element 56 includes, for example, an n-type first clad layer of InAlAs, an active layer 32 of InGaAlAs, a p-type second clad layer 33 of InAlAs, and an etching stop layer 34 of InGaAlAs successively formed in this order on a compound semiconductor such as a semiconductor substrate 30 formed from InP. Moreover, the semiconductor laser element 56 has a stripe-shaped ridge 39 on the etching stop layer 34 on the active layer 32. The ridge 39 includes a p-type third clad layer 35 arranged on the etching stop layer 34, a barrier mitigating layer 36 arranged on the third clad layer 35, and a contact (cap) layer 37 arranged on the barrier mitigating layer 36. The third clad layer 35 is formed, for example, from InP and the contact layer 37 is formed, for example, from InGaAs. The barrier mitigating layer 36 has a two-layer structure, for example, and a first barrier mitigating layer 36a and a second barrier mitigating layer 36b are formed from InGaAsP, for example.

Here, on the plane orthogonal to the width direction of the substrate 30, the direction of light output from the semiconductor laser element 56 is called a second direction (Y direction) and the direction vertical to the second direction is called a first direction (X direction).

Moreover, the ridge represents a protruding island area (protrusion) and the ridge 39 of the third embodiment has a stripe-shaped protrusion structure extending in the Y direction.

Moreover, the contact (cap) layer is a layer for reducing the contact resistance between the crystal and the electrode. The active layer is a layer which emits light when current is injected.

Moreover, a portion above and below the active layer or a portion arranged so as to surround the active layer is called a clad. The ridge structure located above and below the active layer is called a clad layer.

As shown in FIG. 18 and FIG. 19, the contact layer 37 of the ridge 39 has an upper surface 37x having a width 37w along the X direction larger than the width of the lower surface opposing to the upper surface 37x along the X direction. The contact layer 37 has two side surfaces located at positions opposing to each other and inclined to approach each other downward from the upper surface 37x of the contact layer 37. That is, the contact layer 37 has a reversed mesa structure in which the two sides (37x1, 37x2) located at opposing positions of the upper surface 37x in the X direction in such a manner that the first side 37x1 is located outside the first side of the lower surface located at the same side as the first side 37x1 and the second side 37x2 is located outside the second side of the lower surface located at the same side as the second side 37x2.

As shown in FIG. 18, and FIG. 19, the contact layer 37 of the ridge 39 has an upper surface 37x having a width 37w in the X direction larger than the width 35w of the third clad layer 35 of the ridge 39. That is, in the X direction, the ridge 39 has such a structure that the first side 37x1 of the upper surface 37x of the contact layer 37 is located outside the first side 35z1 of the third clad layer 35 positioned at the same side as the first side 37x1 and the second side 37x2 of the upper surface 37x of the contact layer 37 is located outside the second side 35z2 of the third clad layer 35 positioned at the same side as the second side 37x2.

As shown in FIG. 17 and FIG. 18, an insulation film 40 is arranged to cover the two sides of the ridge 39 in the X direction on the etching stop layer on the active layer 32. The insulation layer may be, for example, an insulation film having two-layered structure consisting of a silicon oxide film and a silicon nitride film formed in this order from the side of the substrate.

In the ridge 39, the upper surface 37x of the contact layer 37 is entirely exposed from the insulation film 40 (not covered by the insulation film 40) while the two sides of the barrier mitigating layer 36 and the third clad layer 35 in the X direction are completely covered by the insulation film 20. The insulation film 40 terminates at the sides of the contact layer 37 of the ridge 39 so as to cover the two sides of the ridge 39 in the X direction.

On the insulation film 40, an electrode (for example, anode electrode) 42 is arranged so as to cover the ridge 39. The electrode 42 is electrically connected to the contact layer 37 on the ridge 39. The electrode 42 has, for example, a layered structure consisting of a Ti film 42a, a Pt film 42b, and an Au film 42c successively formed in this order on the insulation film 40. The Ti film 42a is arranged mainly to suppress diffusion of atoms of the Au film 42c into the ridge 39. The Pt film 42b is arranged mainly to increase the attachment between the Ti film 42a and the Au film 42c. The Au film 442c is arranged mainly to suppress oxidization and lower the resistance.

On the rear surface of the substrate 30 opposing to the main surface, an electrode (for example, a cathode electrode) 43 electrically connected to the substrate 30 is arranged.

The semiconductor laser element 56 is cut open in the longitudinal direction of the ridge 39 and as shown in FIG. 17, has a cleavage plane 56a and a cleavage plane 56b opposing to each other. Although not depicted, the cleavage plane 56a is covered with a film of a low reflectivity or a high reflectivity and the cleavage plane 56b is covered with a film of high reflectivity.

As shown in FIG. 18 and FIG. 19, a resonance region (light emitting portion) 32a is arranged at the active layer 32 immediately below the ridge 39. When a a predetermined voltage is applied to the electrode 25 and the electrode 26, the current mostly flows through the ridge 39 and flows into the resonance region 32a immediately below the ridge 39. The electrical energy by this current is converted into light in the resonance region 32a and resonated in the opposing cleavage planes 56a and 56b, and it is output as a laser light from the cleavage plane 56a.

Here, explanation will be given on the trouble when the sides of the ridge 39 in the X direction are not covered by the insulation film 40 with reference to FIG. 18 and FIG. 19.

In the ridge-type semiconductor laser element 56 having the electrode 42 using the Ti/Pt/Au structure, coverage of the sides of the ridge 39 in the X direction with the insulation film 40 greatly affects the reliability. For example, an insulation film such as a silicon oxide film has a barrier effect against diffusion of Au. Accordingly, when the sides of the ridge 39 in the X direction are covered completely with the insulation film, it is possible to prevent diffusion of Au into the ridge 39 from the Au film 42c of the electrode 42 though the sides of the ridge 39 even if the coverage of the sides of the ridge with the Ti film 42a is incomplete. However, when the sides of the ridge 39 are not covered completely, Au is diffused into the ridge 39 from the Au film 42c if the coverage of the sides of the ridge 39 with the Ti film 42a is incomplete. Since Au is easily diffused into the crystal, the Au coming into the ridge is further diffused with lapse of time, reaching the resonance region (light emitting portion) 32a arranged in the active layer 32 immediately below the ridge 39. Since the region where Au is diffused absorbs light, intrusion of Au into the resonance region 32a lowers the conversion efficiency of current-light conversion.

The Ti film 42a is formed by deposition, for example. Such a Ti film 42a has worse coverage at the sides of the ridge 39 than the flat portion. Accordingly, the thickness of the Ti film 42a is smaller at the sides of the ridge 39. Moreover, because of the manufacturing irregularities and processing trouble, the thickness of the Ti film 42a at the sides of the ridge 39 becomes smaller.

Consequently, it is necessary to cover the sides of the ridge 39 in the X direction completely with the insulation film. Especially Au is easily diffused in the InP layer as compared to the InGaAs layer. Accordingly, the sides ($35z1$, $35z2$) of the third clad layer 35 formed from InP in the X direction should be covered completely with the insulation film.

In the third embodiment, the sides of the third clad layer 35, the barrier mitigating layer 36, and the contact layer 37 in the X direction, i.e., the sides of the ridge 39 in the X direction are covered by the insulation film 40 completely. Accordingly, even if the coverage of the sides of the ridge with the Ti film 42a is incomplete, it is possible to prevent diffusion of Au coming into the ridge 39 from the Au film 42c of the electrode 42, thereby providing a semiconductor laser element of a high reliability.

Next, explanation will be given on manufacturing of the semiconductor laser element 56 with reference to FIG. 20A, FIG. 20B to FIG. 28A, FIG. 28B. It should be noted that in manufacturing a semiconductor laser element, firstly, a semiconductor substrate is prepared. Actually, a large-size semiconductor substrate called a wafer is prepared and at the last stage of element formation, the wafer is cut in the longitudinal and lateral directions into pieces of semiconductor laser elements (semiconductor laser chips). However, for convenience, explanation will be given on manufacturing of a single semiconductor laser element.

Firstly, a compound semiconductor such as a semiconductor substrate 30 (hereinafter, simply referred to as a substrate) formed from InP, for example, is prepared. After this, as shown in FIG. 20, on the main surface of the substrate 30, an n-type first clad layer 31 is formed from InAlAs, an active layer 32 is formed from InGaAlAs, a p-type second clad layer 33 is formed from InAlAs, an etching stop layer 34 is formed from InGaAlAs, a third clad layer 35 is formed from InP, a barrier mitigating layer 36 having a first and a second barrier mitigating layer (36a, 36b) formed from InGaAsP, and a contact layer 37 is formed from InGaAs in this order. These layers are formed by the MOCVD (metalorganic chemical vapor deposition) method or the MBE (molecular beam epitaxy) method.

Figure 21A:
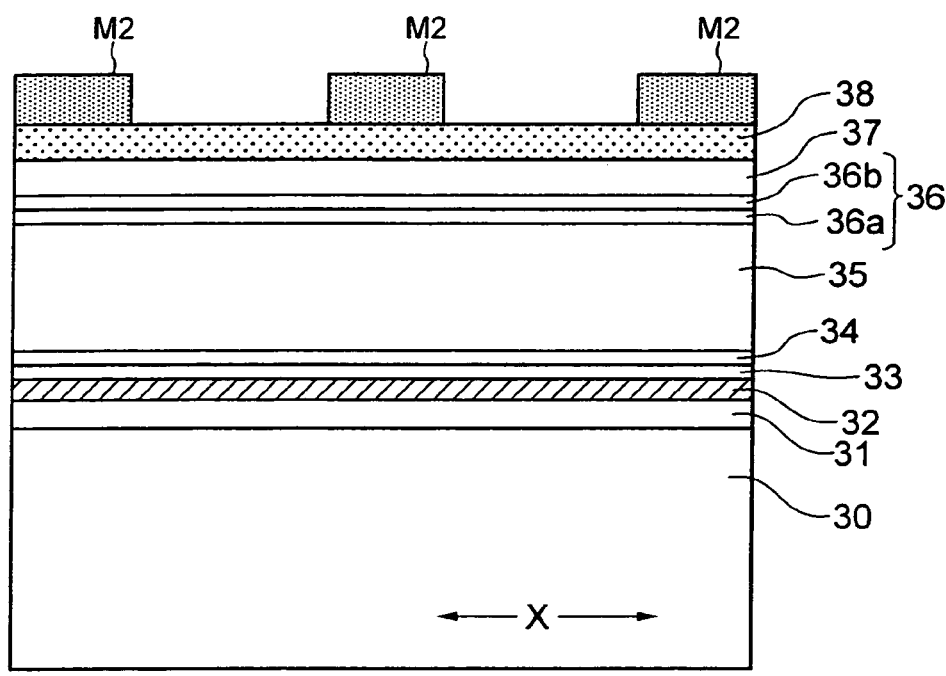
FIG. 21A is a cross sectional view of the semiconductor laser element during a manufacturing step following FIG. 20
Figure 21B:
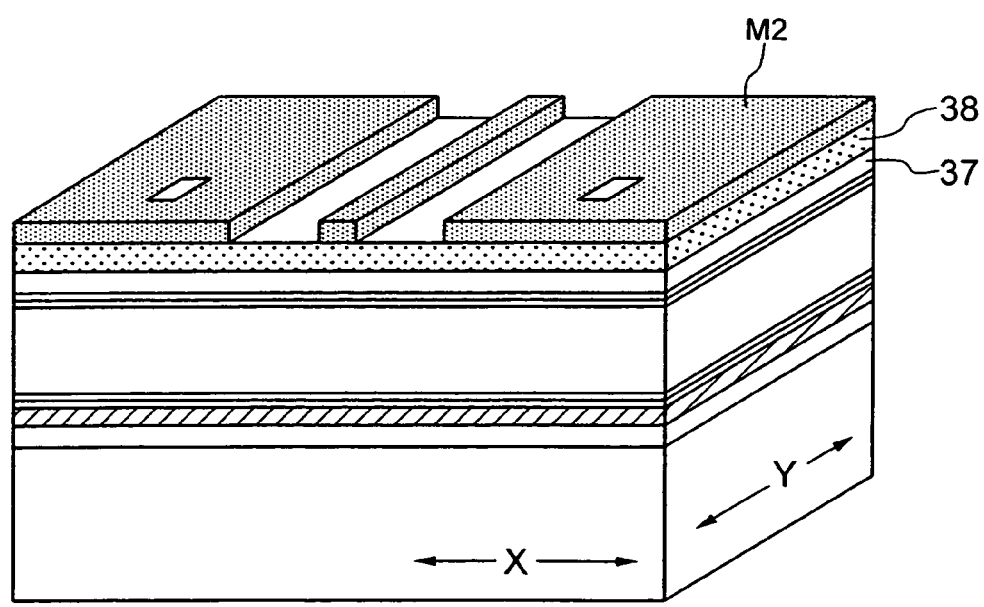
FIG. 21B is a perspective view of FIG. 21A.

Next, as shown in FIG. 21A and FIG. 21B, an insulation film 38 of silicon oxide, for example, is formed on the contact layer 37 by the CVD method.

Figure 22A:
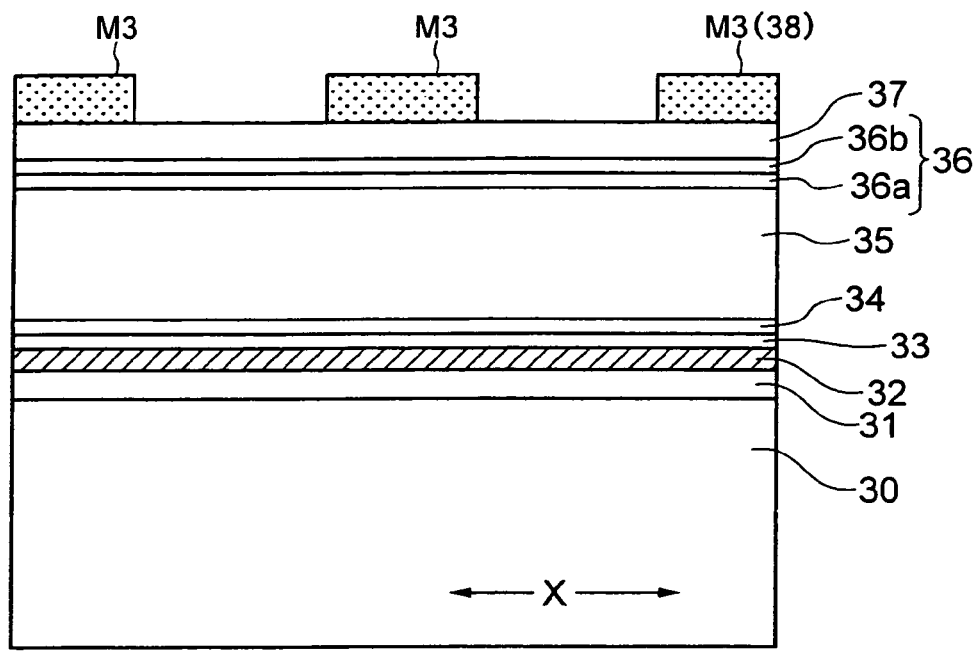
FIG. 22A is a cross sectional view of the semiconductor laser element during a manufacturing step following FIG. 21
Figure 22B:
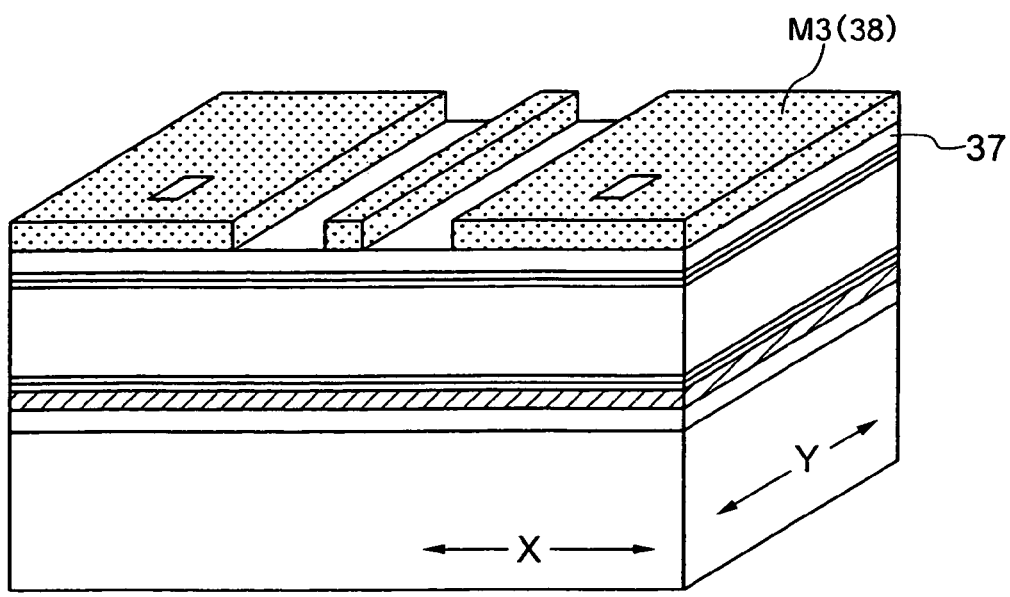
FIG. 22B is a perspective view of FIG. 22A.

Next, as shown in FIGS. 21A and 21B, a mask M2 of photo resist is formed on the insulation film 38. After this, the mask M2 is used as an etching mask for etching the insulation film 38 and a mask M3 of the insulation film 38 is formed as shown in FIG. 22A and FIG. 22B. This mask M3 is used for forming the ridge 39.

Figure 23A:
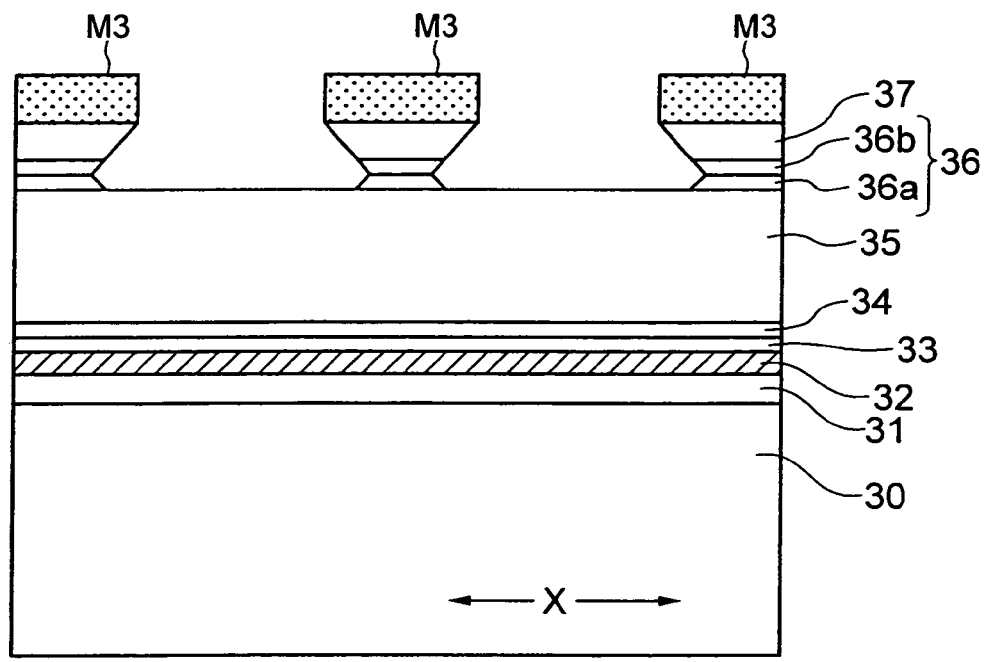
FIG. 23A is a cross sectional view of the semiconductor laser element during a manufacturing step following FIG. 22
Figure 23B:
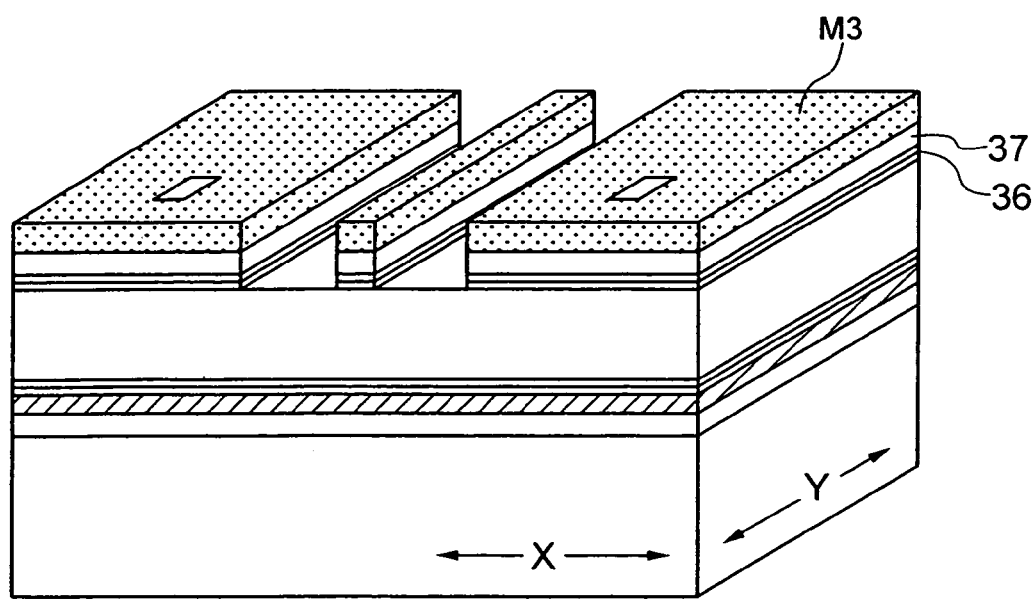
FIG. 23B is a perspective view of FIG. 23A.

Next, by using the mask M3 as an etching mask, the contact layer 37 and the barrier mitigating layer 36 are etched as shown in FIG. 23A and FIG. 23B. The etching of the contact layer 37 and the barrier mitigating layer 36 is performed by the wet etching method using an etching solution containing 1% or more of $H_3PO_4$, $H_2O_2$. In the third embodiment, the etching solution used contains $H_3PO_4$: $H_2O_2$: $H_2O=1:1:10$.

In this step the etching proceeds along the crystal face direction of the contact layer 37 and accordingly, as shown in FIG. 23A and FIG. 23B, in the ridge formation region covered by the mask M3, the contact layer 37 is formed with a mesa structure having the width of the upper surface in the X direction is greater than the width of the lower surface in the X direction. More specifically, as shown in FIG. 19, among the two sides ($37x1$, $37x2$) of the upper surface $37x$ opposing to each other, the first side $37x1$ is located outside the first side of the lower surface located at the same side as the first side $37x1$ and the second side $37x2$ is located outside the second side of the lower surface located at the same side as the second side $37x2$, thereby forming a reversed mesa structure.

Figure 24A:
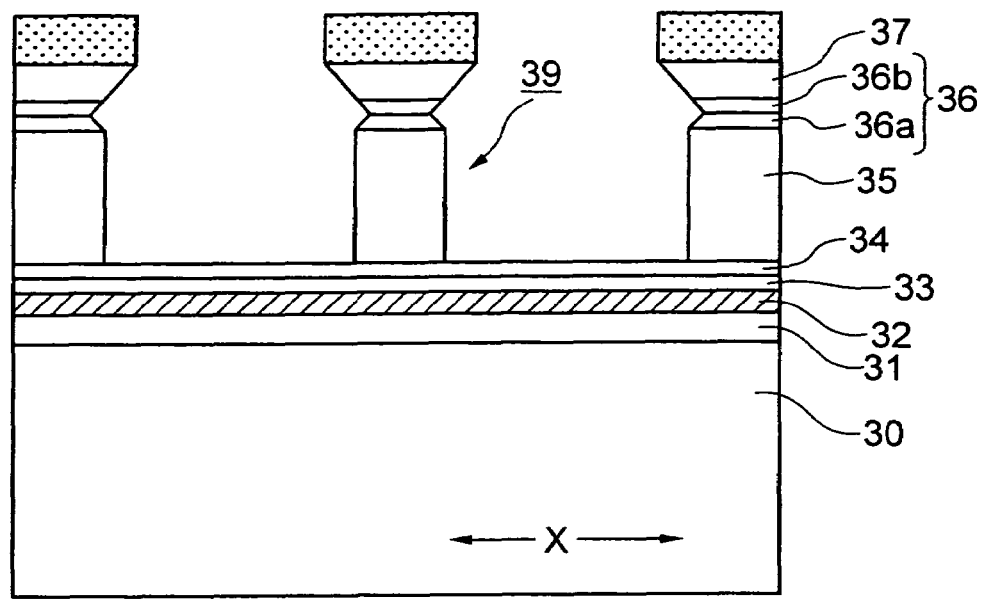
FIG. 24A is a cross sectional view of the semiconductor laser element during a manufacturing step following FIG. 23
Figure 24B:
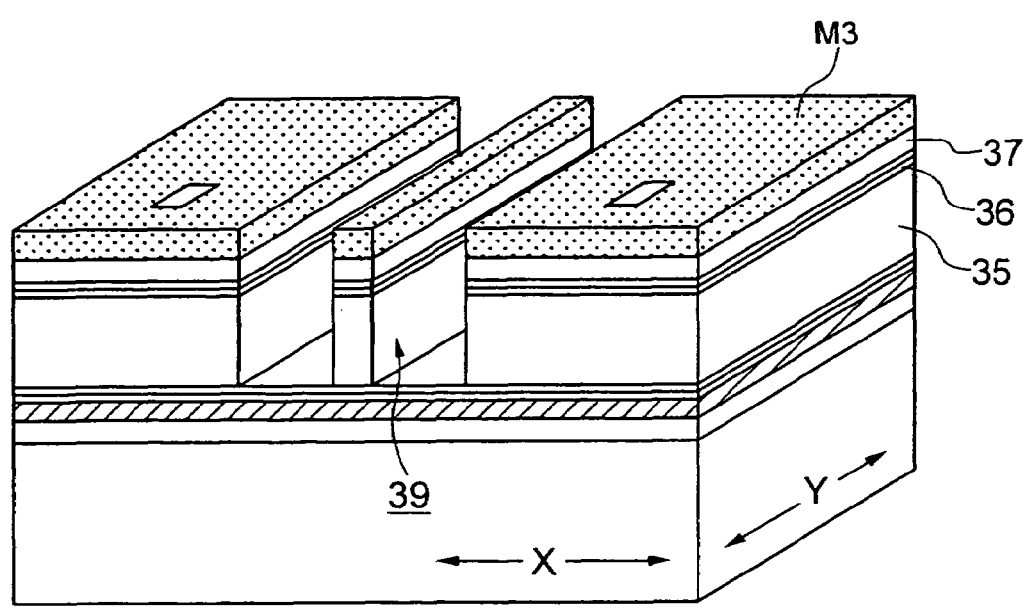
FIG. 24B is a perspective view of FIG. 24A.

Next, by using the mask M3 as an etching mask, as shown in FIG. 24A and FIG. 24B, the third clad layer 35 is etched. The etching of the third clad layer 35 is performed by the wet etching method using the etching solution capable of containing a selected ratio with respect to the contact layer 37.

Moreover, in the ridge formation region below the mask M3, the etching is performed in such a manner that the width of the third clad layer 35 in the X direction is smaller than the width of the upper surface of the contact layer 37 in the X direction. More specifically, as shown in FIG. 19, in the X direction, the first side 37x1 of the upper surface 37x of the contact layer 37 is located outside the first side 35z1 of the third clad layer 35 located at the same side as the first side 37x1 and the second side 37x2 of the upper surface 37x of the contact layer 37 is located outside the second side 35z2 of the third clad layer located at the same side as the second side 37x2. The third embodiment uses an etching solution containing HCL $H_3PO_4$=1:4.

By this step, as shown in FIG. 19, the ridge 39 is formed in such a manner that in the X direction, the first side 37x1 of the upper surface 37x of the contact layer 37 is located outside the first side 35z1 of the third clad layer 35 located at the same side as the first side 37x1 and the second side 37x2 of the upper surface 37x of the contact layer 37 is located outside the second side 35z2 of the third clad layer 35 located at the same side as the second side 37x2.

Figure 25A:
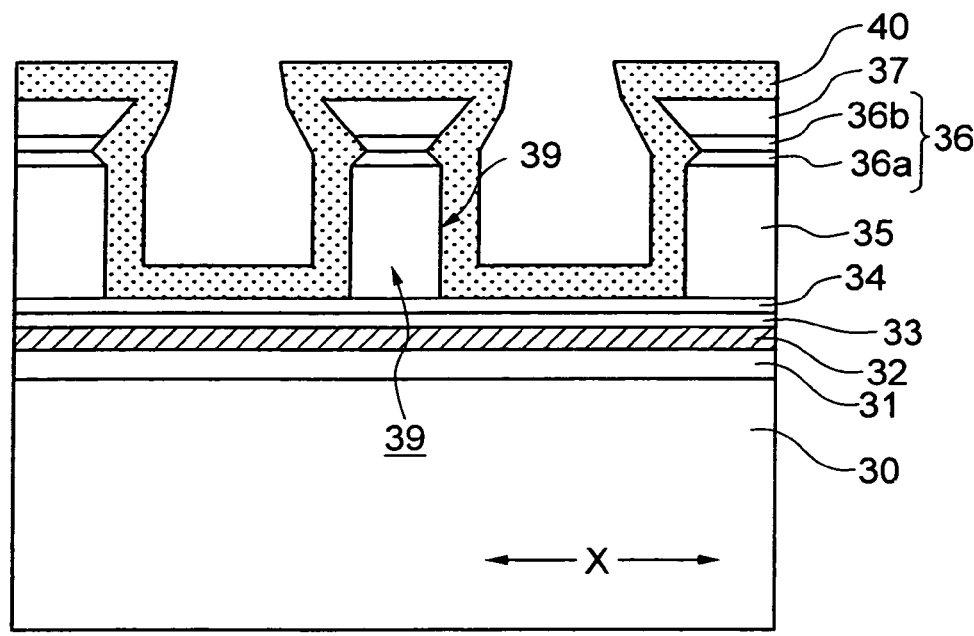
FIG. 25A is a cross sectional view of the semiconductor laser element during a manufacturing step following FIG. 24
Figure 25B:
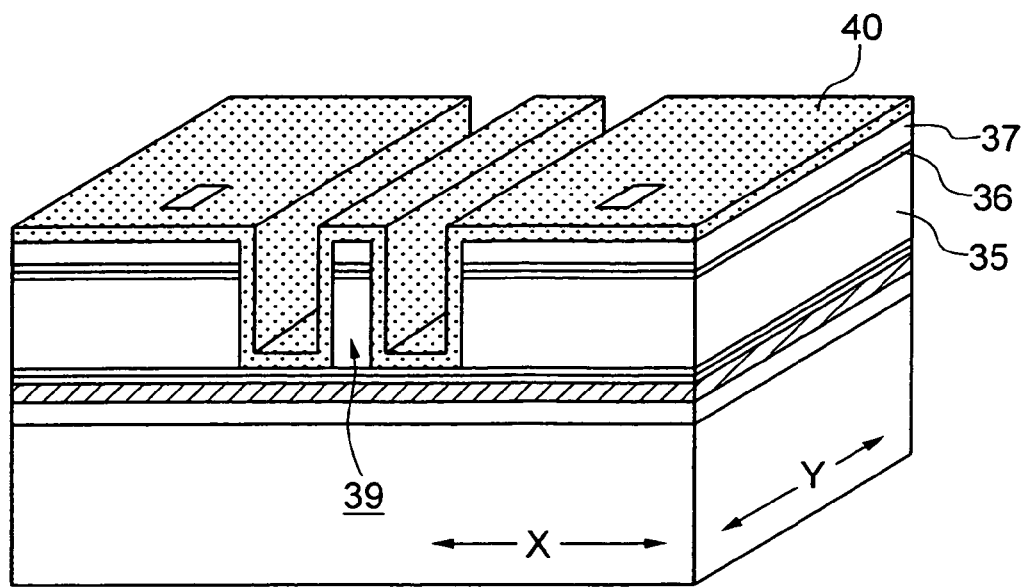
FIG. 25B is a perspective view of FIG. 25A.

Next, the mask M3 is removed. After this, as shown in FIG. 25A and FIG. 25B, the entire surface of the etching stop layer 34 including the ridge 39 is covered by an insulation film consisting of two layers, for example, a silicon oxide film and a silicon nitride film formed by the CVD method. By this step, the top and sides of the ridge 39, the top and sides of the contact layer 37, sides of the barrier mitigating layer 36, and the sides of the third clad layer 35 are covered completely by the insulation film 40.

Figure 26A:
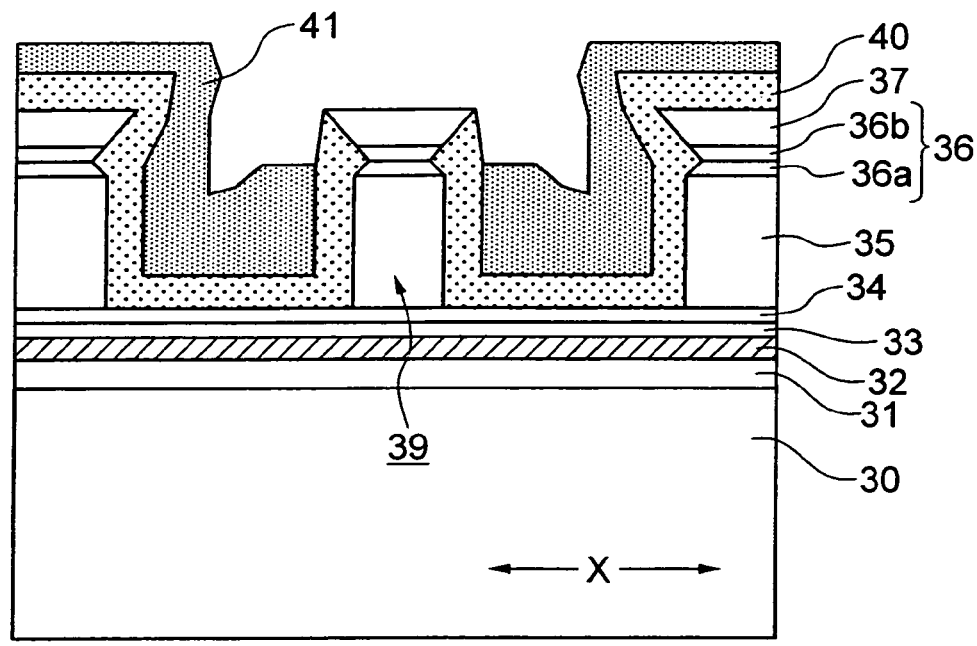
FIG. 26A is a cross sectional view of the semiconductor laser element during a manufacturing step following FIG. 25
Figure 26B:
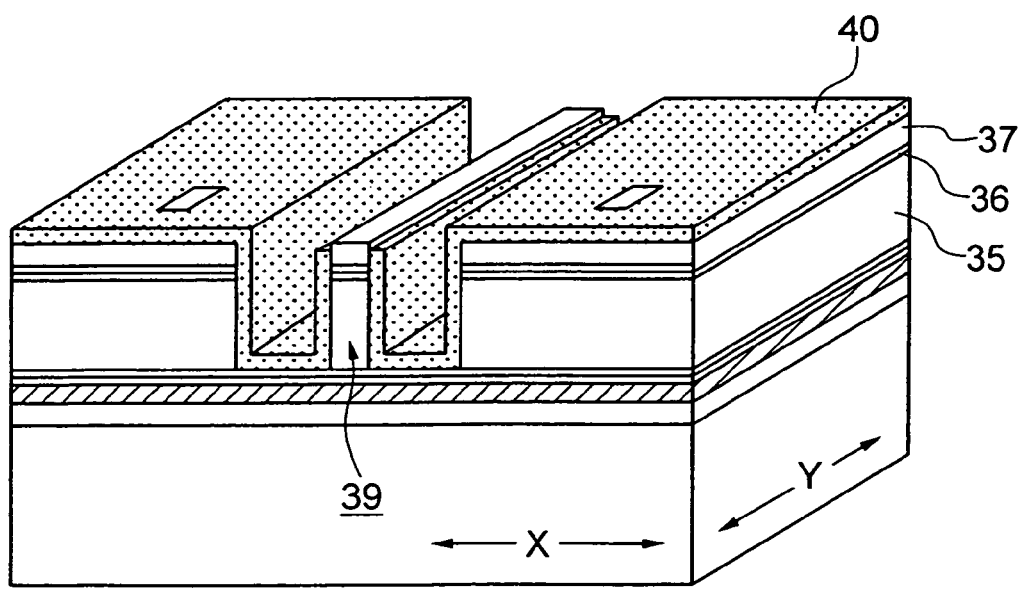
FIG. 26B is a perspective view of FIG. 26A.

Next, for example, a photosensitive resist film 41 is formed by the spin coat method over the entire surface of the insulation film 40 so as to cover the ridge 39, After this, the photosensitive resist film 41 is selectively exposed by using a mask. After this, the photosensitive resist film 41 is selectively removed from the ridge 39. After this, by using the photosensitive resist film 41 as an etching mask, as shown in FIGS. 26A and 26B, the insulation film 40 on the ridge 39 is selectively removed by the anisotropic dry etching method such as the RIE.

By this step, as shown in FIG. 19, the ridge 39 has the following structure in the X direction: the first side 37x1 of the upper surface 37x of the contact layer 37 is located outside the first side 35z1 of the third clad layer 35 located at the same side as the first side 37x1 and the second side 37x2 of the upper surface 37x of the contact layer 37 is located outside the second side 35z2 of the third clad layer 35 located at the same side as the second side 37x2. Accordingly, even if over-etching is caused when removing the insulation film 40 from the ridge 39, it is possible to selectively remove the insulation film 40 from the ridge 39 while covering the X-direction sides of the contact layer 37, the X-direction sides of the barrier mitigating layer 36, and the X-direction sides of the third clad layer 35.

Figure 27A:
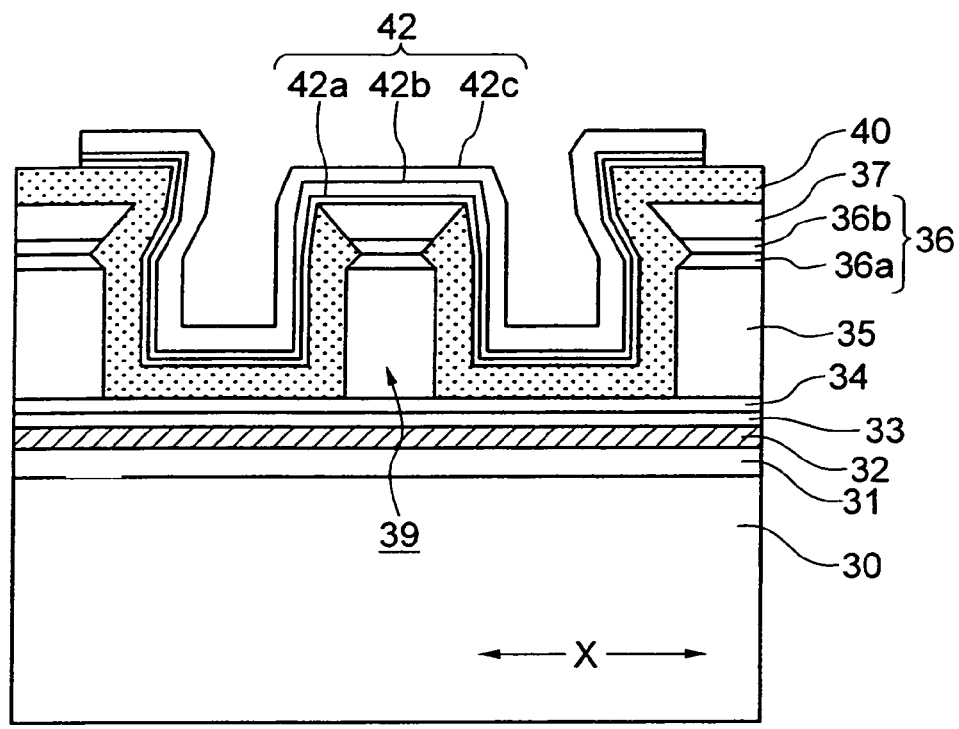
FIG. 27A is a cross sectional view of the semiconductor laser element during a manufacturing step following FIG. 26
Figure 27B:
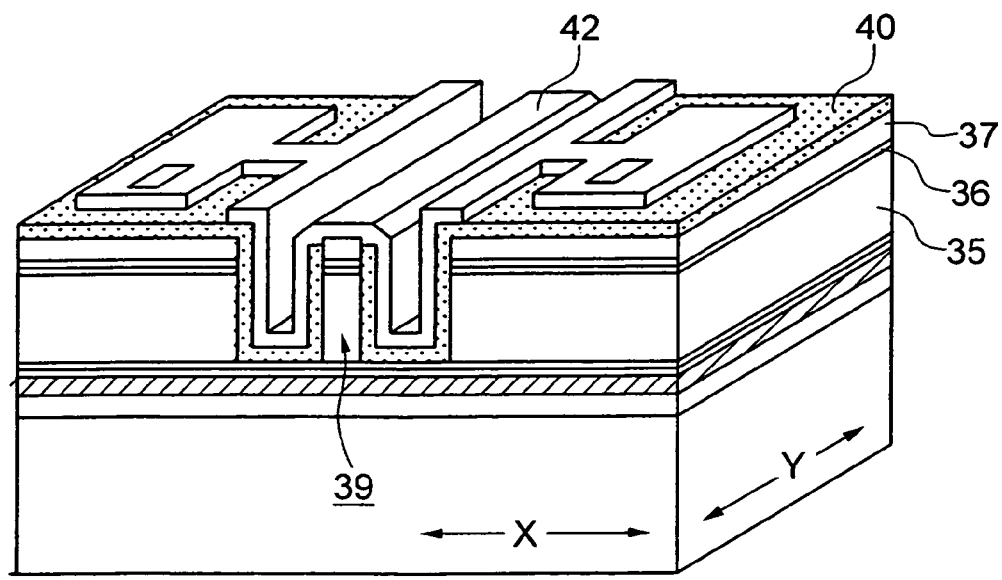
FIG. 27B is a perspective view of FIG. 27A.

Next, the photosensitive resist film 41 is removed. After this, over the entire surface of the insulation film 40 including the ridge 39, a Ti film 42a, a Pt film 42b, and an Au film 424c are successively formed by deposition, for example. After this, the Au film 42c, the Pt film 42b, and the Ti film 42a are successively patterned, thereby forming an electrode 42 as shown in FIG. 27A and FIG. 27B. By this step, the electrode 42 is connected to the entire area of the upper surface 37x of the contact layer 37.

Figure 28A:
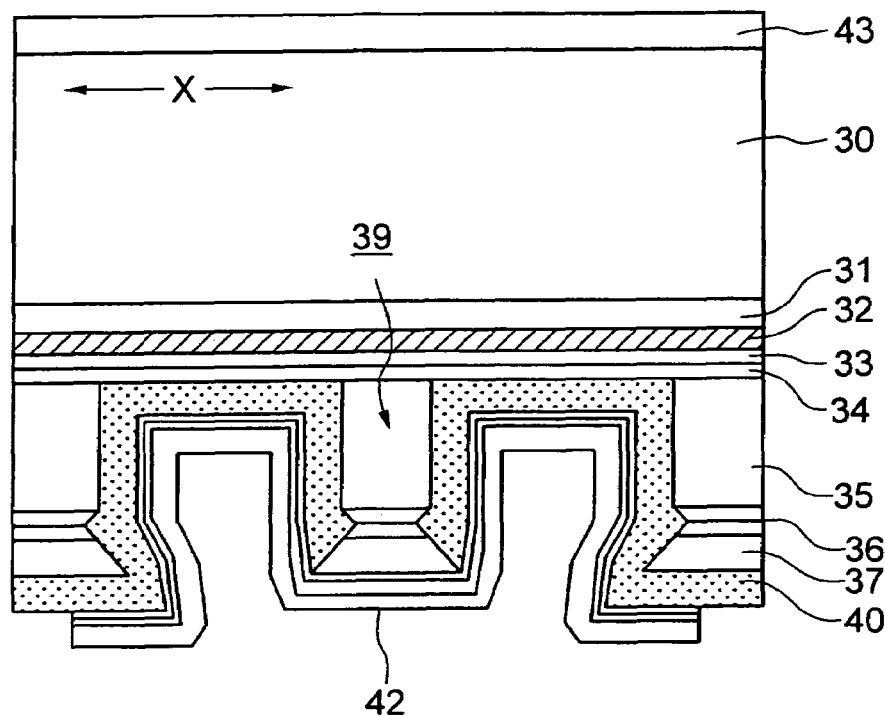
FIG. 28A is a cross sectional view of the semiconductor laser element during a manufacturing step following FIG. 27
Figure 28B:
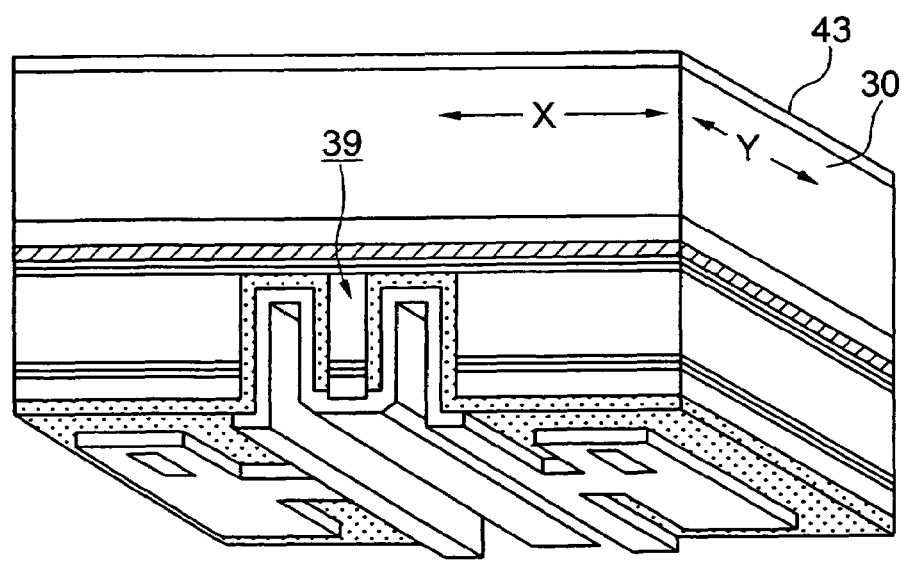
FIG. 28B is a perspective view of FIG. 28A.

Next, the rear surface of the substrate 30 is polished to make the thickness thinner. After this, as shown in FIGS. 28A and 28B, an electrode 43 is formed on the rear surface of the substrate 30. After this, thermal treatment is performed to increase the ohmic contact characteristic between the contact layer 37 of the ridge 39 and the electrode 42 and the ohmic contact characteristic between the substrate 30 and the electrode 43. The thermal treatment is performed, for example, at the substrate temperature of 350 to 400 degrees C. for 10 minutes.

In this step, even if the coverage of the Ti film 42a at the X-direction sides of the ridge 39 becomes incomplete, it is possible to suppress diffusion of the Ay of the Au film 42c from the X-direction sides of the ridge 39 into its interior because the X-direction sides of the ridge 39 are covered completely by the insulation film 40.

Next, the substrate 30 is cleaved to obtain a strip in which a plurality of ridge-type semiconductor laser elements 56 are arranged in the X direction. After this, one (cleavage plane 56a) of the two cleavage planes of the strip located at the opposing side in the Y direction is covered with a film of low reflectivity or a film of high reflectivity and the other (cleavage plane 56b) is covered with a film of high reflectivity. After this, a scratch is made on the strip for breaking. After this, the strip is attached to a resin tape. After this, an external force is applied to the strip by using a roller or the like so as to break the strip, thereby obtaining a ridge-type semiconductor laser element 56 shown in FIG. 17 to FIG. 19.

The ridge-type semiconductor laser element 56 thus manufactured is mounted on the main surface of the pedestal 53, as shown in FIG. 15, in the assembling step (manufacturing) of the semiconductor laser device 50. The semiconductor laser element 56 is fixed, for example, by soldering. Here, the heat (for example, 300 to 350 degrees C.) for melting the solder is applied to the semiconductor laser element 56.

When the heat is applied, the Au of the Au film 42 is easily diffused. The diffusion of Au is caused by the thermal treatment performed to increase the ohmic contact characteristic between the contact layer 37 of the ridge 39 and the electrode 42 and the ohmic contact characteristic between the substrate 30 and the electrode 43 and the thermal treatment performed when the semiconductor laser element 56 is soldered to the pedestal 53.

However, since the X-direction side surfaces of the ridge 39 are covered completely by the insulation film 40, it is possible to suppress diffusion of Au of the Au film from the side surfaces into the interior of the ridge 39 which may be caused by these thermal treatment.

Thus, in the third embodiment, it is possible to cover the X-direction side surfaces of the ridge 39 completely by the insulation film.

Moreover, since it is possible to cover the X-direction side surfaces of the ridge 39 completely by the insulation film 40, it is possible to provide a semiconductor laser element having a high reliability.

Figure 29:
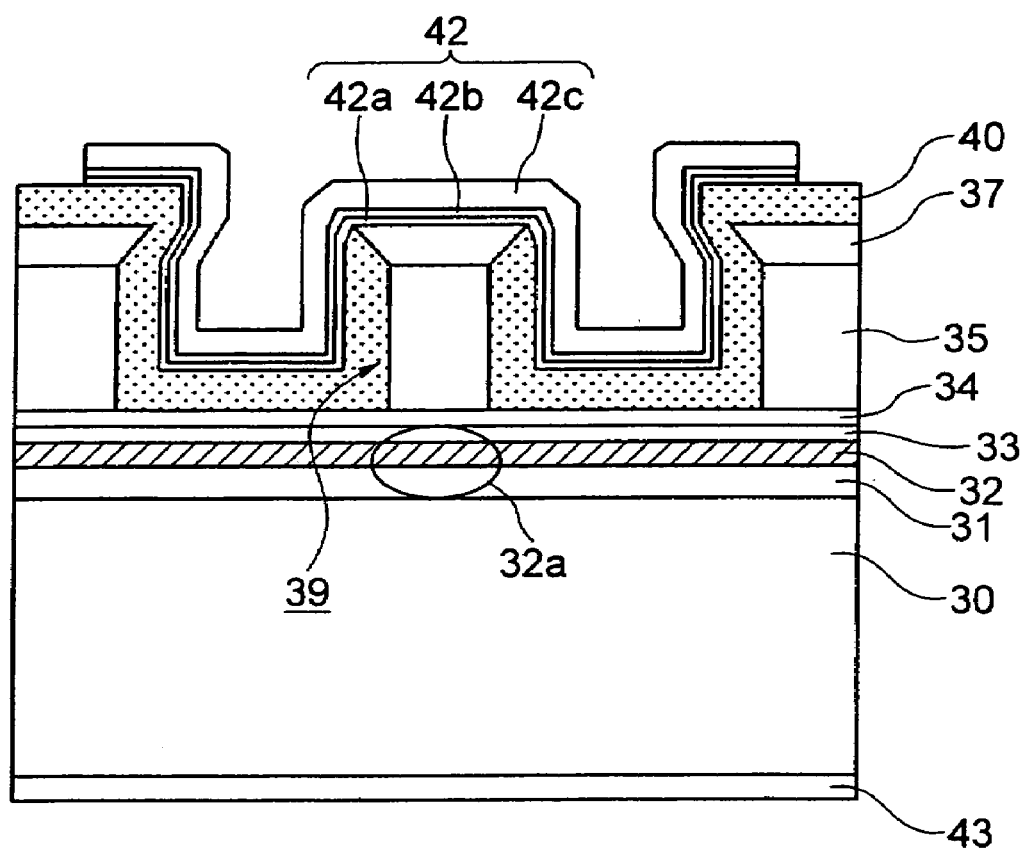
FIG. 29 is a cross sectional view of an essential portion of a semiconductor laser element as a modified example of the third embodiment of the present invention.

It should be noted that in the third embodiment, explanation has been given on the present invention applied to a semiconductor laser element having the ridge 39 containing the barrier mitigating layer 36. However, as shown in FIG. 29, the present invention can also be applied to a semiconductor laser element having the ridge 39 not containing the barrier mitigating layer 36.

Moreover, in the third embodiment, explanation has been given on the present invention applied to a semiconductor laser element formed from an InP-based material. However, the present invention can also be applied to a semiconductor laser element formed from a GaAs-based material having the ridge, for example, containing a third clad layer formed from AlGaAs and a contact layer formed from P-GaAs.

The present invention has been thus far explained according to the aforementioned embodiments. However, the present invention is not to be limited to these embodiments but may be modified in various ways without departing from the spirit and scope of the invention.

The main effects obtained by the invention disclosed in this application are as follows.

According to the present invention, it is possible to provide a semiconductor laser element capable of reducing a contact resistance and a thermal resistance and realizing a high reliability.

Moreover, according to the present invention, it is possible to provide a semiconductor laser device capable of reducing a contact resistance and a thermal resistance and realizing a high reliability.

Moreover, according to the present invention, it is possible to provide a novel semiconductor laser element and a semiconductor laser device having a high reliability.

What is claimed is:

1. A semiconductor laser element comprising:
    a semiconductor substrate,
    an active layer formed over the semiconductor substrate,
    a ridge having a clad layer formed on the active layer and a contact layer formed over the clad layer,
    an insulation film covering the side surfaces of the clad layer, and
    an electrode connected to the contact layer,
    wherein the insulation layer has an end portion in the ridge thickness direction located between the upper surface and the lower surface of the contact layer.

2. A semiconductor laser element as claimed in claim 1, wherein
    the electrode is formed over the active layer so as to cover the ridge, and
    the insulation film is arranged between the side surface of the ridge and the electrode.

3. A semiconductor laser element as claimed in claim 1, wherein
    the contact layer has an upper surface having a width greater than a width of a lower surface.

4. A semiconductor laser device comprising a semiconductor laser element said semiconductor laser element including: a semiconductor substrate, an active layer formed over the semiconductor substrate, a ridge having a clad layer formed on the active layer and a contact layer formed over the clad layer, an insulation film covering the side surfaces of the clad layer, and an electrode connected to the contact layer,
    wherein the insulation layer has an end portion in the ridge thickness direction located between the upper surface and the lower surface of the contact layer.

5. A semiconductor laser element comprising:
    a plurality of semiconductor layers formed over a semiconductor substrate,
    a ridge having a first semiconductor layer formed on the plurality of semiconductor layers and a contact layer formed over the first semiconductor layer,
    an insulation film covering the side surfaces of the ridge in a first direction, and
    an electrode connected to the contact layer,
    wherein the upper surface of the contact layer has a width in the first direction greater than a width of the lower surface of the contact layer in the first direction.

6. A semiconductor laser element comprising:
    a plurality of semiconductor layers formed over a semiconductor substrate,
    a ridge having a first semiconductor layer formed on the plurality of semiconductor layers and a contact layer formed over the first semiconductor layer,
    an insulation film covering the side surfaces of the ridge in a first direction, and
    an electrode connected to the contact layer,
    wherein the upper surface of the contact layer has a width in the first direction greater than a width of the lower surface of the contact layer in the first direction and greater than a width of the first semiconductor layer in the first direction.

* * * * *